United States Patent
Li et al.

(10) Patent No.: US 10,685,729 B2
(45) Date of Patent: Jun. 16, 2020

(54) SHIFT REGISTER ELEMENT, METHOD FOR DRIVING THE SAME, AND DISPLAY PANEL

(71) Applicant: Shanghai Tianma AM-OLED Co., Ltd, Shanghai (CN)

(72) Inventors: Yue Li, Shanghai (CN); Renyuan Zhu, Shanghai (CN); Dongxu Xiang, Shanghai (CN); Zhonglan Cai, Shanghai (CN); Juan Zhu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 227 days.

(21) Appl. No.: 15/864,598

(22) Filed: Jan. 8, 2018

(65) Prior Publication Data
US 2018/0130541 A1 May 10, 2018

(30) Foreign Application Priority Data
Jul. 7, 2017 (CN) .......................... 2017 1 0551719

(51) Int. Cl.
*G11C 19/00* (2006.01)
*G11C 19/18* (2006.01)
(Continued)

(52) U.S. Cl.
CPC .......... *G11C 19/184* (2013.01); *G09G 5/003* (2013.01); *G11C 19/28* (2013.01); *G09G 3/3677* (2013.01); *G09G 2310/0286* (2013.01)

(58) Field of Classification Search
None
See application file for complete search history.

(56) References Cited

U.S. PATENT DOCUMENTS

2006/0197554 A1* 9/2006 Jinta .................... G11C 19/184
326/81
2008/0101529 A1* 5/2008 Tobita .................. G09G 3/3677
377/64

(Continued)

FOREIGN PATENT DOCUMENTS

| CN | 101145398 A | 3/2008 |
|---|---|---|
| CN | 104795106 A | 7/2015 |

(Continued)

*Primary Examiner* — Tuan T Lam
(74) *Attorney, Agent, or Firm* — Alston & Bird LLP

(57) ABSTRACT

Disclosed are a shift register element, a method for driving the same, and a display panel. The method includes: an output module including a first node and a third node, wherein the output module is configured to provide an output terminal with a signal of a first signal terminal or a second signal terminal according to voltage applied to the first node and the third node; a first driver configured to control the voltage of the first node, and voltage of a second node according to signals of the first input terminal and the second input terminal; a second driver configured to control voltage of the third node according to the voltage of the first node and the second node; and a feedback regulation module configured to control voltage of the first node according to the signal of the output terminal, and signals of a third input terminal and a fourth input terminal.

16 Claims, 18 Drawing Sheets

(51) Int. Cl.
*G11C 19/28* (2006.01)
*G09G 5/00* (2006.01)
*G09G 3/36* (2006.01)

(56) References Cited

U.S. PATENT DOCUMENTS

| | | | | |
|---|---|---|---|---|
| 2013/0170606 | A1* | 7/2013 | Matsui | G11C 19/28 |
| | | | | 377/64 |
| 2017/0004771 | A1* | 1/2017 | Lee | G09G 3/20 |
| 2017/0256204 | A1* | 9/2017 | Xiang | G09G 3/3266 |
| 2017/0287388 | A1* | 10/2017 | Ma | G09G 3/20 |
| 2018/0090072 | A1* | 3/2018 | Sun | G09G 3/3258 |
| 2018/0130542 | A1* | 5/2018 | Li | G09G 5/003 |
| 2018/0211716 | A1* | 7/2018 | Ma | G09G 3/20 |
| 2018/0240394 | A1* | 8/2018 | Feng | G11C 19/184 |
| 2018/0322820 | A1* | 11/2018 | Yang | G09G 3/20 |
| 2018/0357974 | A1* | 12/2018 | Zheng | G11C 19/28 |
| 2018/0374410 | A1* | 12/2018 | Zhu | G09G 3/20 |

FOREIGN PATENT DOCUMENTS

| | | | |
|---|---|---|---|
| CN | 105405383 A | 3/2016 | |
| CN | 106486065 A | 3/2017 | |

* cited by examiner

SHIFT REGISTER ELEMENT, METHOD FOR DRIVING THE SAME, AND DISPLAY PANEL

CROSS-REFERENCE TO RELATED APPLICATION

This application claims priority of Chinese Patent Application No. CN 201710551719.8, filed on Jul. 7, 2017, which is hereby incorporated by reference in its entirety.

TECHNOLOGICAL FIELD

The present disclosure relates to the field of display technologies, and optionally to a shift register element, a method for driving the same, and a display panel.

BACKGROUND

As display screens are developing constantly, consumers require higher and higher stability of the display screens. The stability of the display screen is highly reflected on their gate driver circuits, and shift register elements constituting the gate driver circuits.

At present, a shift register element is typically 5T2C structured (including five switch transistors and two capacitors). As illustrated in FIG. 1A which is a schematic structural diagram of a shift register element in the related art, all of a first switch transistor M1 to a fifth switch transistor M5 are P-type thin film transistors. As illustrated in FIG. 1B which is a circuit timing diagram corresponding to the shift register element illustrated in FIG. 1A, potentials of both a first node N1 and a second node N2 are a low level, and both the fourth switch transistor M4 and the fifth switch transistor M5 are switched on, at the instance of time when a second clock signal terminal CKB is changed from a high-level signal to a low-level signal, where short-circuited current may be generated.

SUMMARY

An embodiment of the disclosure provides a shift register element including: an output module including a first node and a third node, configured to provide an output terminal with a signal of a first signal terminal or a second signal terminal according to voltage applied to the first node and the third node; a first driver configured to control the voltage of the first node, and voltage of a second node according to signals of the first input terminal and the second input terminal; a second driver configured to control voltage of the third node according to the voltage of the first node and the second node; and a feedback regulation module configured to control the voltage of the first node according to the signal of the output terminal, and signals of a third input terminal and a fourth input terminal.

Correspondingly an embodiment of the disclosure further provides a method for driving the shift register element according to an embodiment of the disclosure, the method including: a first stage of providing the first input terminal, the fourth input terminal, and the second input terminal with a first potential signal, and the third input terminal with a second potential signal, and outputting the signal of the second signal terminal at the output terminal; a second stage of providing the first input terminal, the third input terminal, and the second input terminal with the first potential signal, and the fourth input terminal with the second input signal, and outputting the signal of the second signal terminal at the output terminal; a third stage of providing the first input terminal, the third input terminal, and the fourth input terminal with the first potential signal, and the second input terminal with the second potential signal, and outputting the signal of the first signal terminal at the output terminal; a fourth stage of providing the fourth input terminal and the second input terminal with the first potential signal, and the first input terminal and the third input terminal with the second potential signal, and outputting the signal of the first signal terminal at the output terminal; a fifth stage of providing the third input terminal and the second input terminal with the first potential signal, and the first input terminal and the fourth input terminal with the second potential signal, and outputting the signal of the first signal terminal at the output terminal; a sixth stage of providing the third input terminal and the fourth input terminal with the first potential signal, and the first input terminal and the second input terminal with the second potential signal, and outputting the signal of the second signal terminal at the output terminal; a seventh stage of providing the fourth input terminal and the second input terminal with the first potential signal, and the first input terminal and the third input terminal with the second potential signal, and outputting the signal of the second signal terminal at the output terminal; and an eighth stage of providing the second input terminal and the third input terminal with the first potential signal, and the first input terminal and the fourth input terminal with the second potential signal, and outputting the signal of the second signal terminal at the output terminal.

Correspondingly an embodiment of the disclosure further provides a display panel including N concatenated shift register elements, each of which is the shift register element according to the embodiment above of the disclosure, and N representing an integer, wherein: the first input terminal of the first level of shift register element is configured to receive the start signal; the first input terminals of the other levels of shift register elements VSRn than the first level of shift register element are connected with the output terminals of their preceding levels of shift register elements; and the output terminal of each level of shift register element other than the last level of shift register element is connected with the first input terminal of its succeeding level of shift register element.

DETAILED DESCRIPTION

Figure 1A:
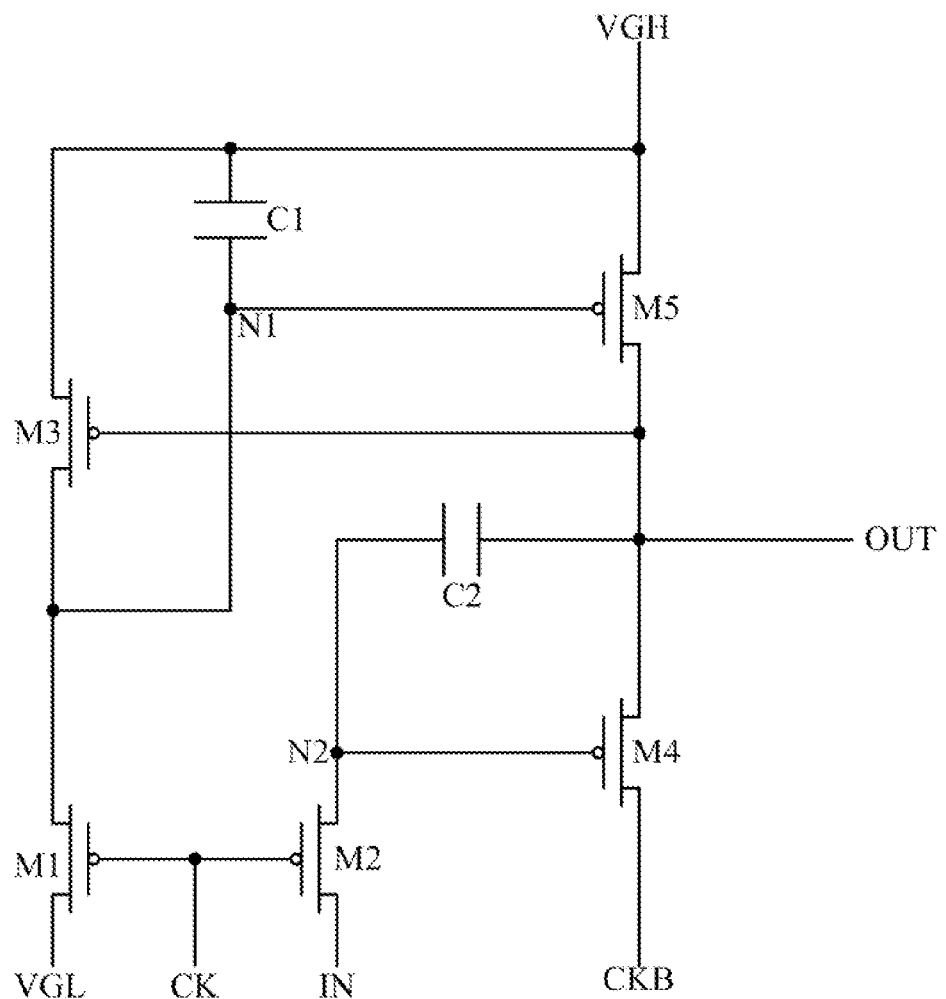
FIG. 1A is a schematic structural diagram of a shift register element in the related art.
Figure 1B:
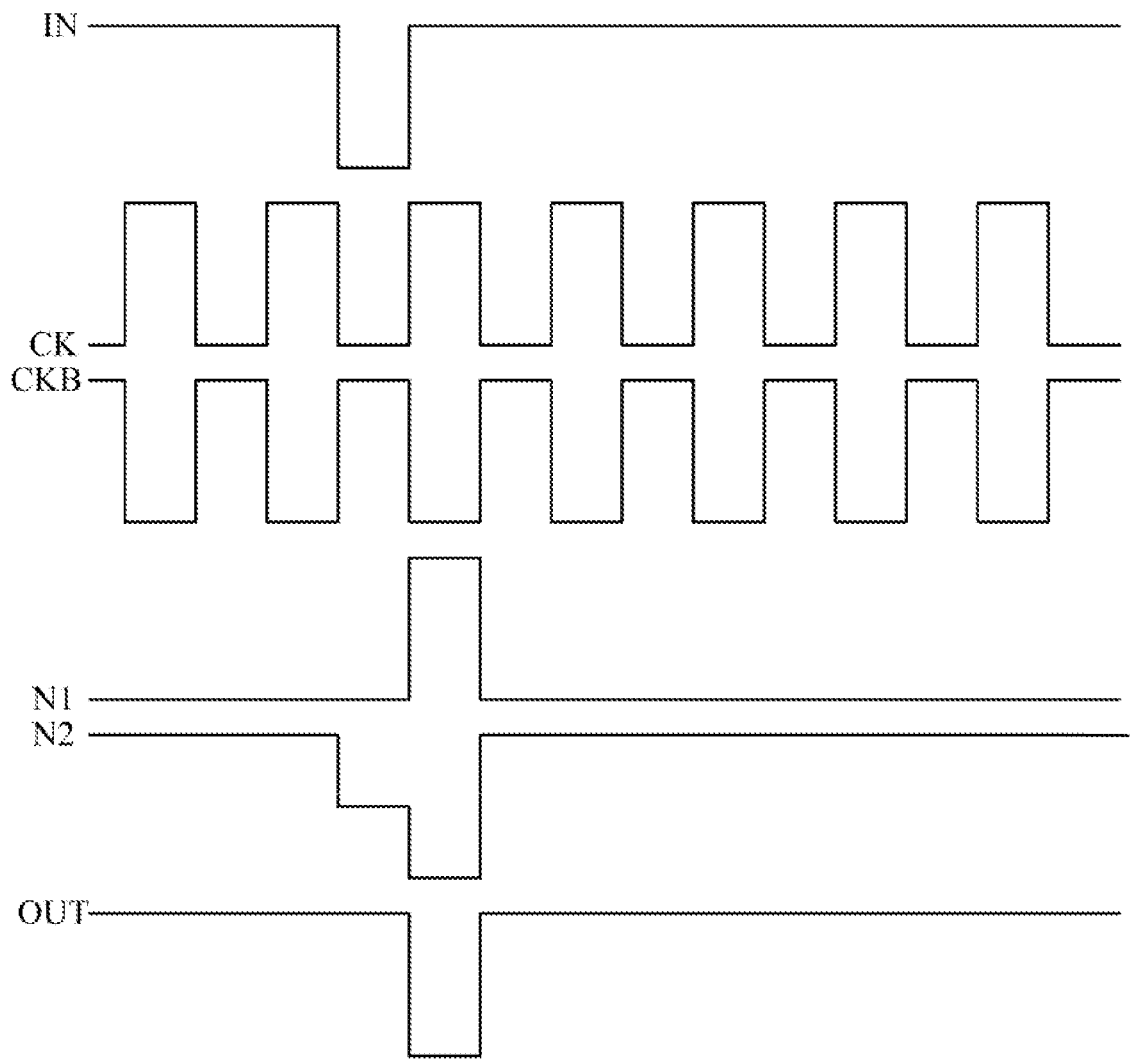
FIG. 1B is a circuit timing diagram corresponding to the shift register element illustrated in FIG. 1A.

In order to make the objects, technical solutions, and advantages of the embodiments of the disclosure more apparent, the disclosure will be described below in further details with reference to the drawings, and apparently the embodiments described below are only a part but not all of embodiments of the disclosure. Based upon the embodiments here of the disclosure, all the other embodiments which can occur to those skilled in the art without any inventive effort shall fall into the scope of the disclosure.

The shapes and sizes of respective components in the drawings are not intended to reflect a real proportion, but only intended to illustrate the disclosure of the disclosure.

Figure 2:
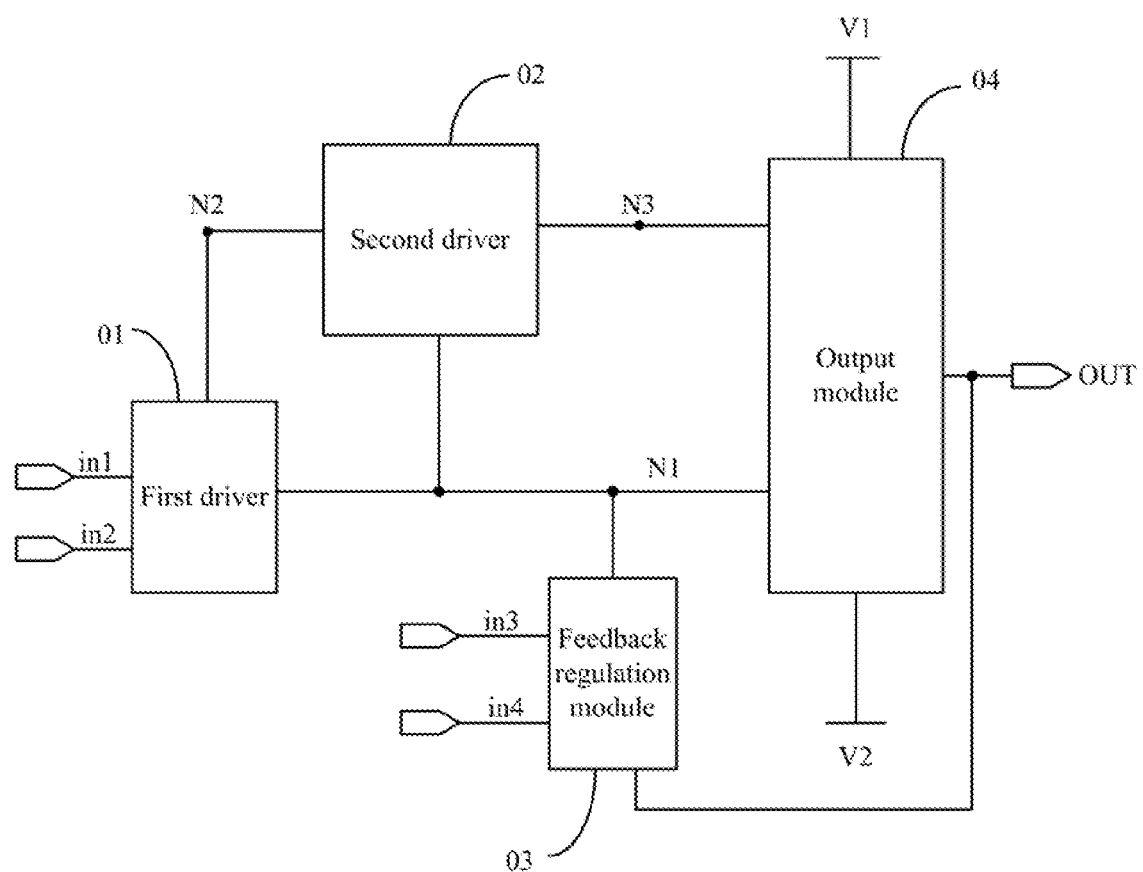
FIG. 2 is a schematic structural diagram of a shift register element according to an embodiment of the disclosure.

FIG. 2 illustrates a schematic structural diagram of a shift register element according to an embodiment of the disclosure, where the shift register element includes followings.

An output module 04 including a first node N1 and a third node N3, configured to provide an output terminal OUT with a signal of a first signal terminal V1 or a second signal terminal V2 according to voltage applied to the first node N1 and the third node N3.

A first driver 01 configured to control the voltage of the first node N1 and voltage of a second node N2 according to signals of a first input terminal in1 and a second input terminal in2.

A second driver 02 configured to control the voltage of the third node N3 according to the voltage of the first node N1 and the second node N2.

A feedback regulation module 03 configured to control the voltage of the first node N1 according to the signal of the output terminal OUT, and signals of a third input terminal in3 and a fourth input terminal in4.

The shift register element according to embodiments of the disclosure includes the output module configured to provide the output terminal with the signal of the first signal terminal or the second signal terminal according to the voltage applied to the first node and the third node, the first driver configured to control the voltage of the first node and the second node according to the signals of the first input terminal and the second input terminal, the second driver configured to control the voltage of the third node according to the voltage of the first node and the second node, and the feedback regulation module configured to control the voltage of the first node according to the signals of the output terminal the third input terminal and the fourth input terminal. Since the feedback regulation module can control the first node according to the output terminal, the potential of the first node can be better stabilized to thereby enable the circuit to output more stably.

Figure 3:
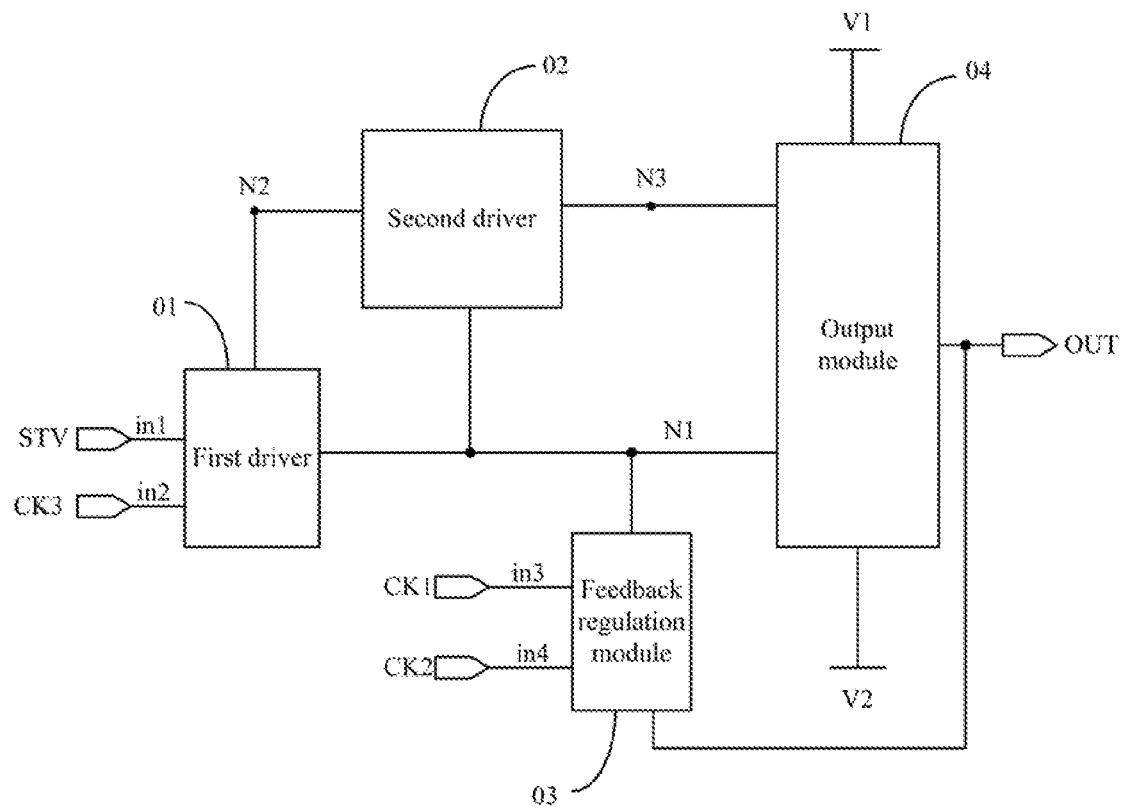
FIG. 3 is a schematic structural diagram of another shift register element according to an embodiment of the disclosure.

Optionally in the shift register element according to embodiments of the disclosure, as illustrated in FIG. 3 which is a schematic structural diagram of another shift register element according to an embodiment of the disclosure, the first input terminal in1 is configured to receive a start signal STV, or a signal output at an output terminal of a preceding level of shift register element (not illustrated); the second input terminal in2 is configured to receive a third clock signal CK3; the third input terminal in3 is configured to receive a first clock signal CK1; and the fourth input terminal in4 is configured to receive a second clock signal CK2.

Optionally in a display panel, typically a first input terminal of a first level of shift register element is configured to receive a start signal, and first input terminals of the other levels of shift register elements than the first level of shift register element are configured to receive signals output at output terminals of their preceding levels of shift register elements. As for the other levels of shift register elements, the signals output at the output terminals of their preceding levels of shift register elements are equivalent to the start signal received by the first level of shift register element, and the same operating principle will apply to them.

Figure 4A:
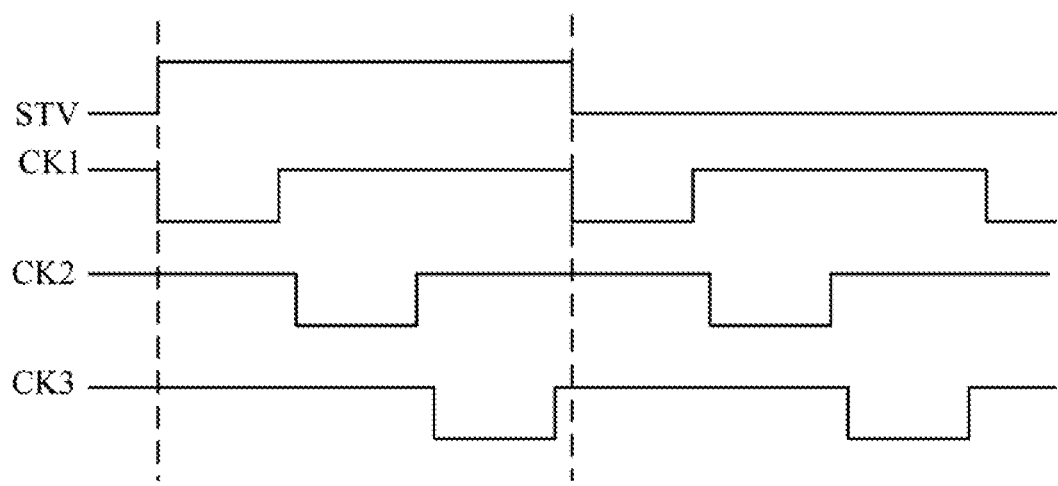
FIG. 4A is a timing diagram of an input signal corresponding to a shift register element according to an embodiment of the disclosure.
Figure 4B:
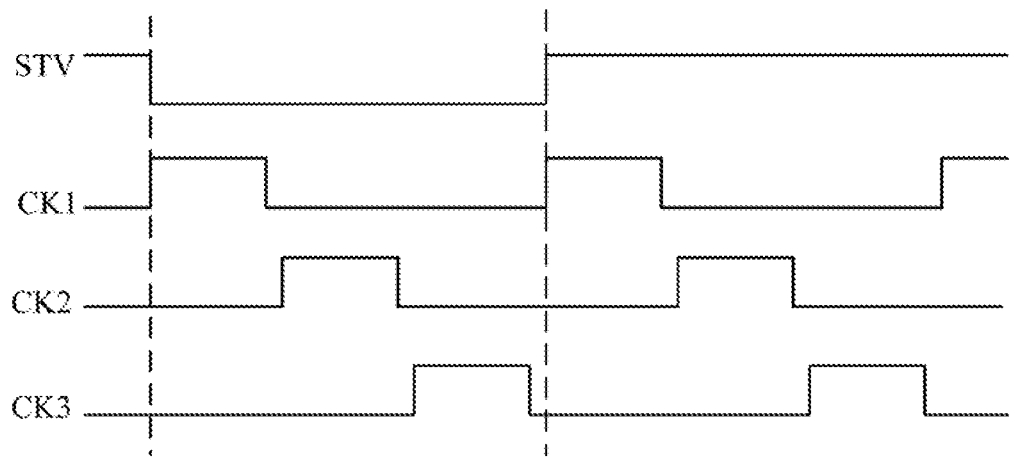
FIG. 4B is another timing diagram of an input signal corresponding to a shift register element according to an embodiment of the disclosure.

Optionally in the shift register element according to embodiments of the disclosure, FIG. 4A is a timing diagram of an input signal corresponding to a shift register element according to an embodiment of the disclosure, and FIG. 4B is a timing diagram of an input signal corresponding to a shift register element according to an embodiment of the disclosure, where there is the same clock cycle for the first clock signal CK1, the second clock signal CK2 and the third clock signal CK3, and phases of the first clock signal CK1, the second clock signal CK2 and the third clock signal CK3 are different by one third of the clock cycle successively.

Optionally in the shift register element according to embodiments of the disclosure, as illustrated in FIG. 4A and FIG. 4B, the start signal STV lasts for one clock cycle.

Optionally in the shift register element according to the embodiment of the disclosure, as illustrated in FIG. 4A, the start signal STV is a high-level signal configured to be overlapping with low-level signals of the first clock signal CK1, the second clock signal CK2 and the third clock signal CK3.

Or Optionally in the shift register element according to the embodiment of the disclosure, as illustrated in FIG. 4B, the start signal STV is a low-level signal configured to be overlapping with high-level signals of the first clock signal CK1, the second clock signal CK2 and the third clock signal CK3.

The disclosure will be described below in details with reference to embodiments thereof. It shall be noted that the embodiments are intended to better set forth the disclosure, but not to limit the disclosure thereto.

Figure 5A:
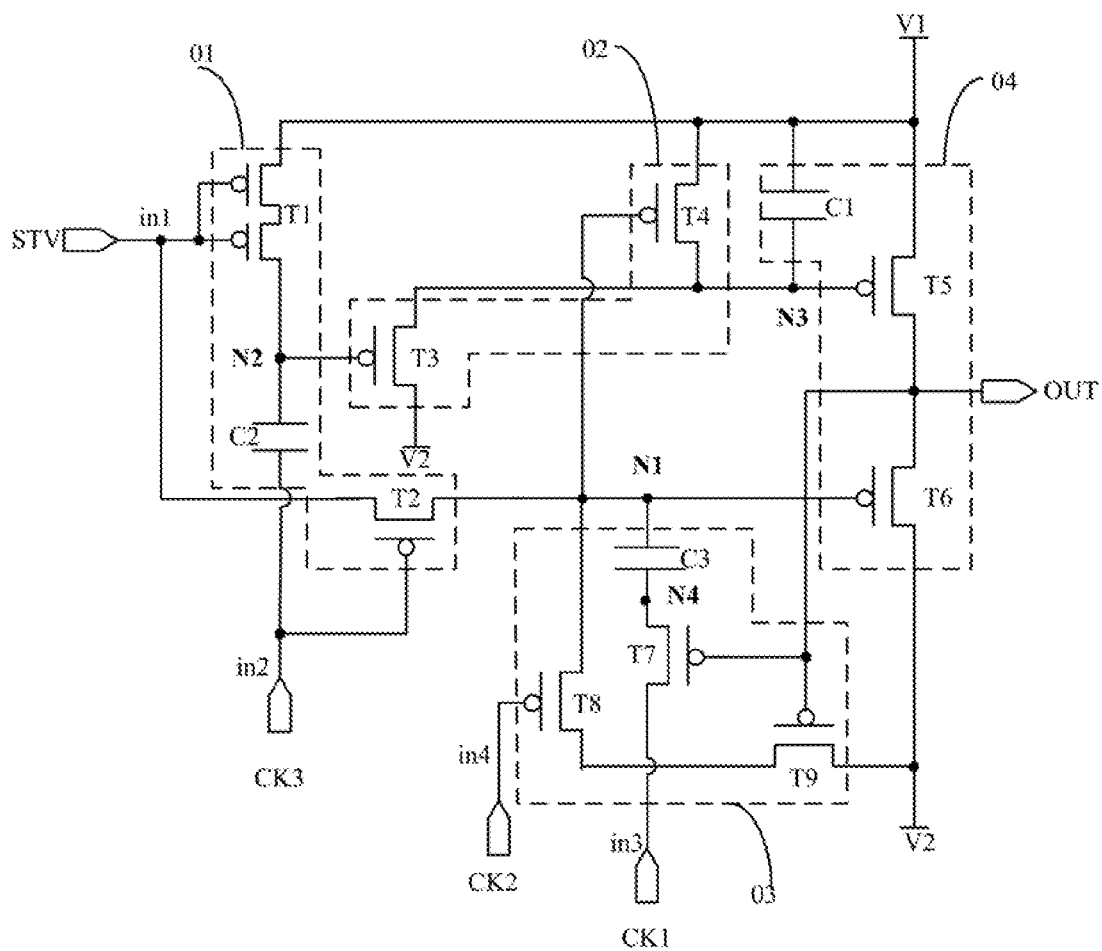
FIG. 5A is a schematic structural diagram of a further shift register element according to an embodiment of the disclosure.
Figure 5B:
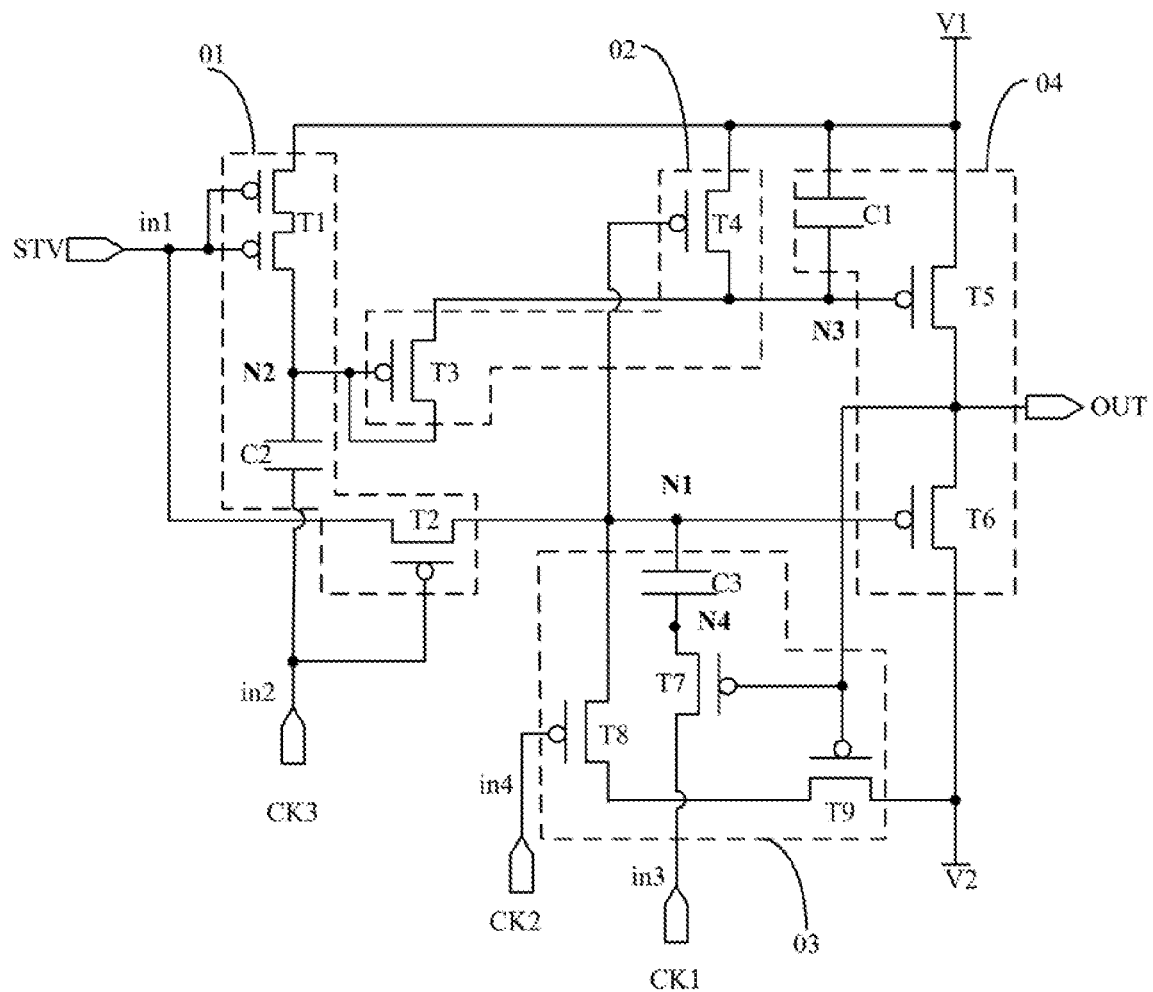
FIG. 5B is a schematic structural diagram of a further shift register element according to an embodiment of the disclosure.
Figure 5C:
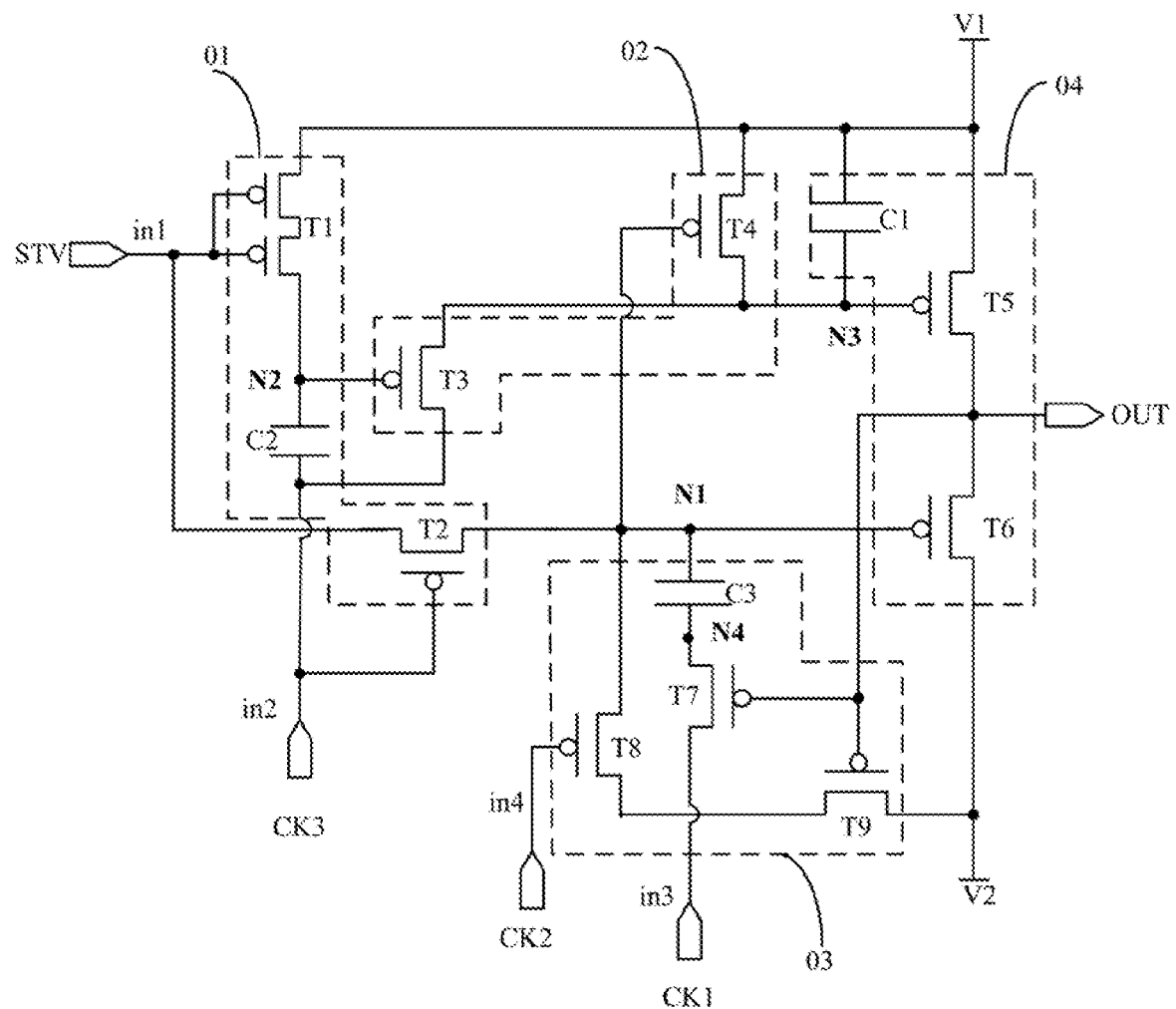
FIG. 5C is a schematic structural diagram of a further shift register element according to an embodiment of the disclosure.

Optionally in the shift register element according to the embodiments of the disclosure, as illustrated in FIG. 5A to FIG. 5C, FIG. 5A is a schematic structural diagram of a further shift register element according to an embodiment of the disclosure; FIG. 5B is a schematic structural diagram of a further shift register element according to an embodiment of the disclosure; and FIG. 5C is a schematic structural diagram of a further shift register element according to an embodiment of the disclosure.

The first driver 01 includes a first transistor T1, a second transistor T2, and a second capacitor C2.

The first transistor T1 has a gate connected with the first input terminal in1, a first pole connected with the first signal terminal V1, and a second pole connected with the second node N2.

The second transistor T2 has a gate connected with the second input terminal in2, a first pole connected with the first input terminal in1, and a second pole connected with the first node N1.

The second capacitor C2 has one terminal connected with the second input terminal, and the other terminal connected with the second node.

Optionally if the first transistor is controlled by the first input terminal to be switched on, then it will provide the second node with the signal of the first signal terminal to control the voltage of the second node; if the second transistor is controlled by the second input terminal to be switched on, then it will provide the first node with the signal of the first input terminal to control the voltage of the first node; and the second capacitor controls the voltage of the second node according to the voltage of the second input terminal.

Optionally in a shift register element according to an embodiment of the disclosure, the first transistor T1 is structured with dual gates to thereby alleviate leakage current of the second node N2 as illustrated in FIG. 5A to FIG. 5C.

Only an optional structure of the first driver in the shift register element has been described above as an example, and in an implementation, the structure of the first driver will not be limited to the structure above according to embodiments of the disclosure, but can alternatively be other structures known to those skilled in the art, so embodiments of the disclosure will not be limited thereto.

Optionally in a shift register element according to an embodiment of the disclosure, as illustrated in FIG. 5A to FIG. 5C, the second driver 02 includes a third transistor T3 and a fourth transistor T4;

The fourth transistor T4 has a gate connected with the first node N1, a first pole connected with the first signal terminal V1, and a second pole connected with the third node N3.

Optionally if the fourth transistor is controlled by the first node to be switched on, then it will provide the third node with the signal of the first signal terminal to control the voltage of the third node.

Optionally as illustrated in FIG. 5C, the third transistor T3 has a gate connected with the second node N2, a first pole connected with the second input terminal in2, and a second pole connected with the third node N3.

Optionally if the third transistor is controlled by the second node to be switched on, then it will provide the third node with the third clock signal of the second input terminal to control the voltage of the third node.

Or optionally as illustrated in FIG. 5B, the third transistor T3 has a gate connected with the second node N2, a first pole connected with the second node N2, and a second pole connected with the third node N3.

Optionally if the third transistor is controlled by the second node to be switched on, then it will provide the third node with the signal of the second node to control the voltage of the third node. Since the third transistor is connected in a diode structure, a P-type diode only allows a low potential to be passed, so that a high potential can be avoided from being written into the third node; and an N-type diode only allows a high potential to be passed, so that a low potential can be avoided from being written into the third node.

Or optionally as illustrated in FIG. 5A, the third transistor T3 has a gate connected with the second node N2, a first pole connected with the second signal terminal V2, and a second pole connected with the third node N3.

Optionally if the third transistor is controlled by the second node to be switched on, then it will provide the third node with the signal of the second signal terminal to control the voltage of the third node. Since the signal of the second signal terminal is a stable direct-current signal, and the third clock signal of the second input terminal is a pulse signal less stable than the direct-current signal, the stability of the third node may be affected while the third clock signal is varying, so if the first pole of the third transistor is connected with the second signal terminal, then the stability of the third node will be avoided from being affected by the input signal of the first pole of the third transistor.

Only an optional structure of the second driver in the shift register element has been described above as an example, and in an implementation, the structure of the second driver will not be limited to the structure above according to embodiments of the disclosure, but can alternatively be other structures known to those skilled in the art, so embodiments of the disclosure will not be limited thereto.

Optionally in a shift register element according to an embodiment of the disclosure, as illustrated in FIG. 5A to FIG. 5C, the output module 04 includes a fifth transistor T5, a sixth transistor T6, and a first capacitor C1.

The fifth transistor T5 has a gate connected with the third node N3, a first pole connected with the first signal terminal V1, and a second pole connected with the output terminal OUT.

The sixth transistor T6 has a gate connected with the first node N1, a first pole connected with the second signal terminal V2, and a second pole connected with the output terminal OUT.

The first capacitor C1 has one terminal connected with the first signal terminal V1, and the other terminal connected with the third node N3.

Optionally if the fifth transistor is controlled by the third node to be switched on, then it will provide the output terminal with the signal of the first signal terminal; if the sixth transistor is controlled by the first node to be switched on, then it will provide the output terminal with the signal of the second signal terminal; and the first capacitor stabilizes the voltage of the third node while the third node is floating.

Only an optional structure of the output module in the shift register element has been described above as an example, and in an implementation, the structure of the output module will not be limited to the structure above according to embodiments of the disclosure, but can alternatively be other structures known to those skilled in the art, so embodiments of the disclosure will not be limited thereto.

Optionally in a shift register element according to an embodiment of the disclosure, as illustrated in FIG. 5A to FIG. 5C, the feedback regulation module 03 includes a seventh transistor T7, an eighth transistor T8, a ninth transistor T9 and a third capacitor C3.

The seventh transistor T7 has a gate connected with the output terminal OUT, a first pole connected with the third input terminal in3, and a second pole connected with a fourth node N4.

The eighth transistor T8 has a gate connected with the fourth input terminal in4, a first pole connected with a second pole of the ninth transistor T9, and a second pole connected with the first node N1.

The ninth transistor T9 has a gate connected with the output terminal OUT, and a first pole connected with the second signal terminal V2.

The third capacitor C3 has one terminal connected with the first node N1, and the other terminal connected with the fourth node N4.

Optionally if the seventh transistor is controlled by the output terminal to be switched on, then it will provide the output terminal with the first clock signal of the third input terminal; and only if the eighth transistor is controlled by the fourth input terminal to be switched on, and the ninth transistor is controlled by the output terminal to be switched on, then the signal of the second signal terminal will be transmitted to the first node. If a valid signal is output at the output terminal, then the potential of the first node will be further affected by the coupling third capacitor to thereby compensate for a drift of the threshold of the sixth transistor so as to enable the entire signal of the second signal terminal to be output at the output terminal. Furthermore the eighth transistor and the ninth transistor can perform a feedback regulation to the potential of the first node using the output terminal to thereby shorten a period of time for which the first node is floating, so as to further improve the stability of the output potential, and to extend a process window.

Only an optional structure of the feedback regulation module in the shift register element has been described above as an example, and in an implementation, the structure of the feedback regulation module will not be limited to the structure above according to embodiments of the disclosure, but can alternatively be other structures known to those skilled in the art, so embodiments of the disclosure will not be limited thereto.

Figure 6A:
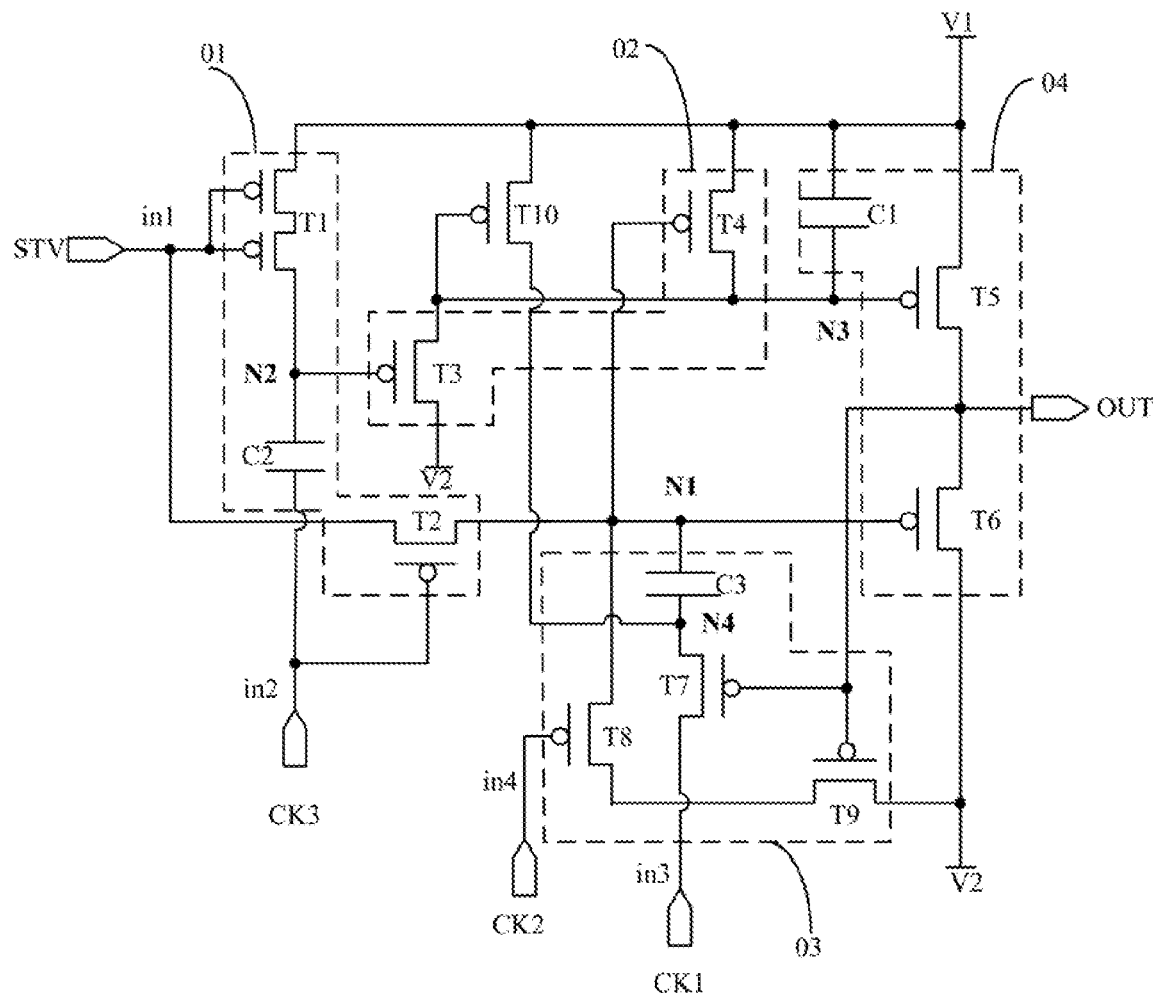
FIG. 6A is a schematic structural diagram of a further shift register element according to an embodiment of the disclosure.
Figure 6B:
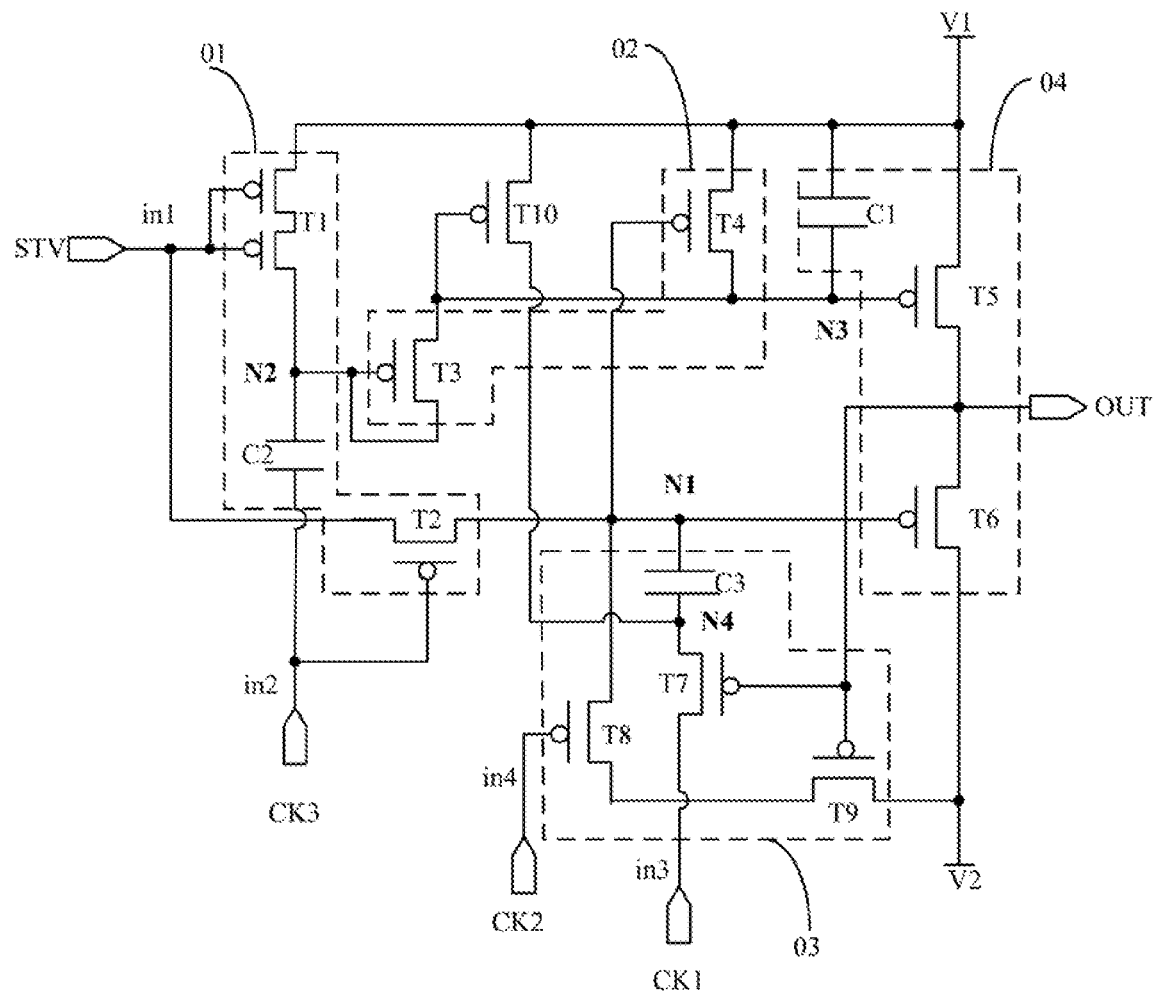
FIG. 6B is a schematic structural diagram of a further shift register element according to an embodiment of the disclosure.
Figure 6C:
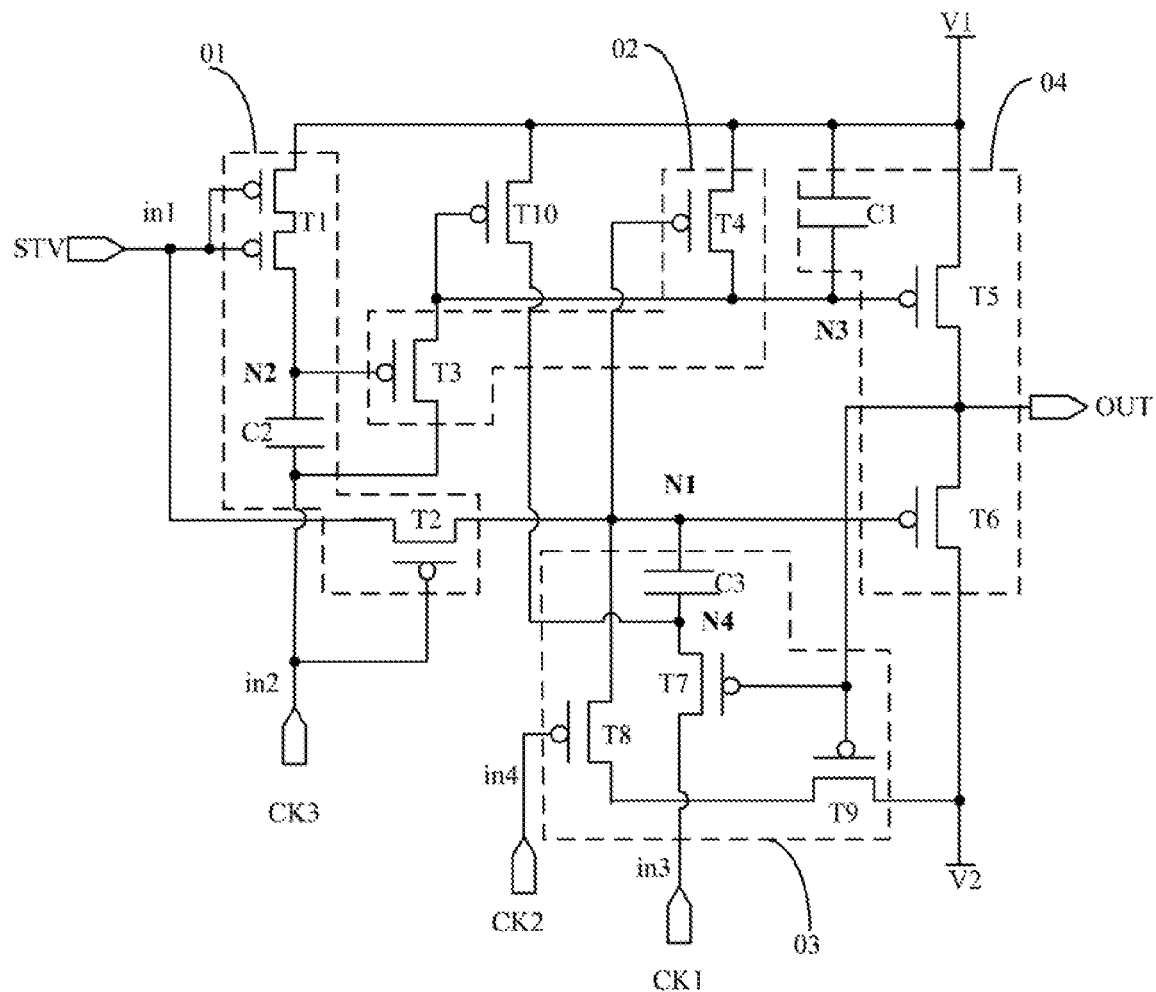
FIG. 6C is a schematic structural diagram of a further shift register element according to an embodiment of the disclosure.
Figure 7A:
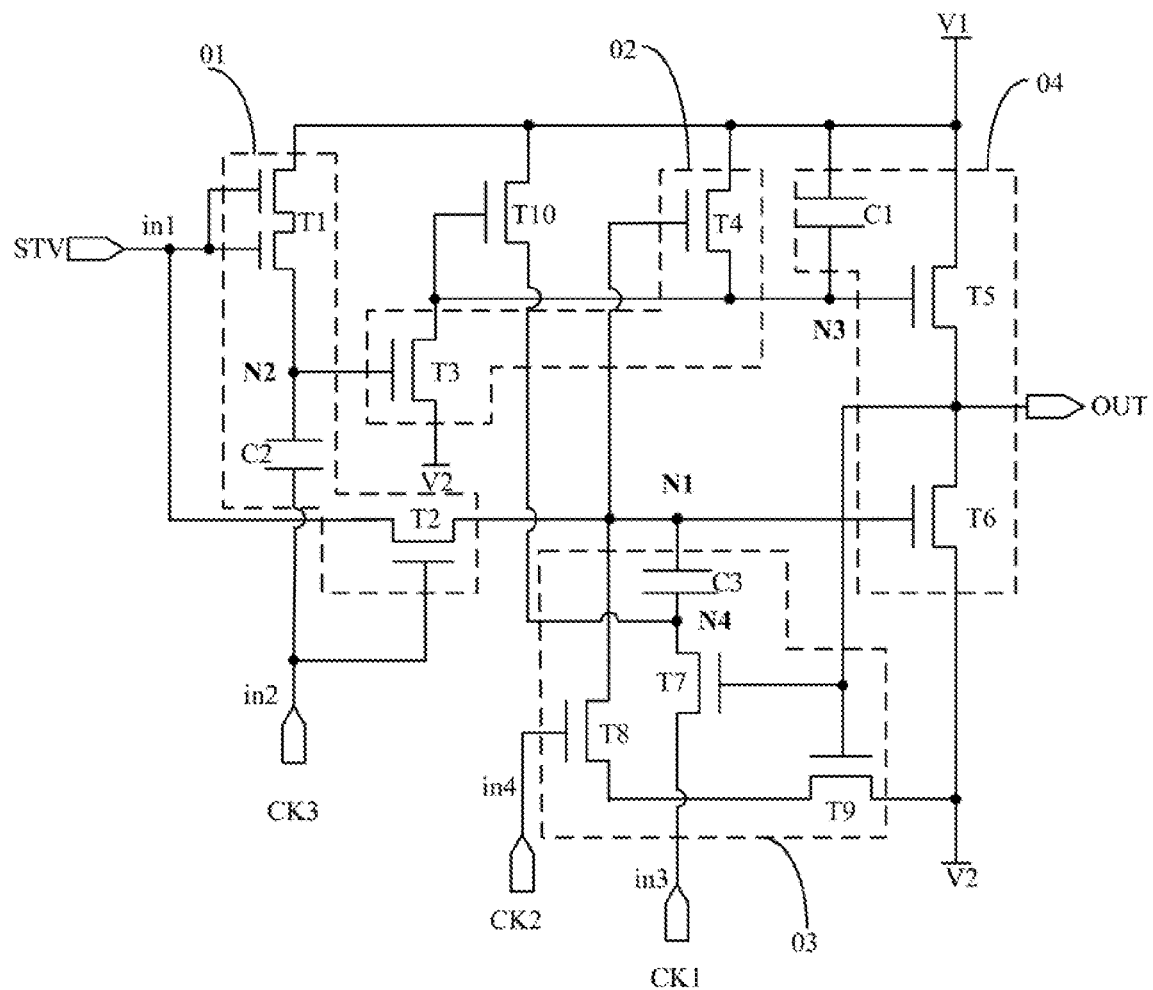
FIG. 7A is a schematic structural diagram of a further shift register element according to an embodiment of the disclosure.
Figure 7B:
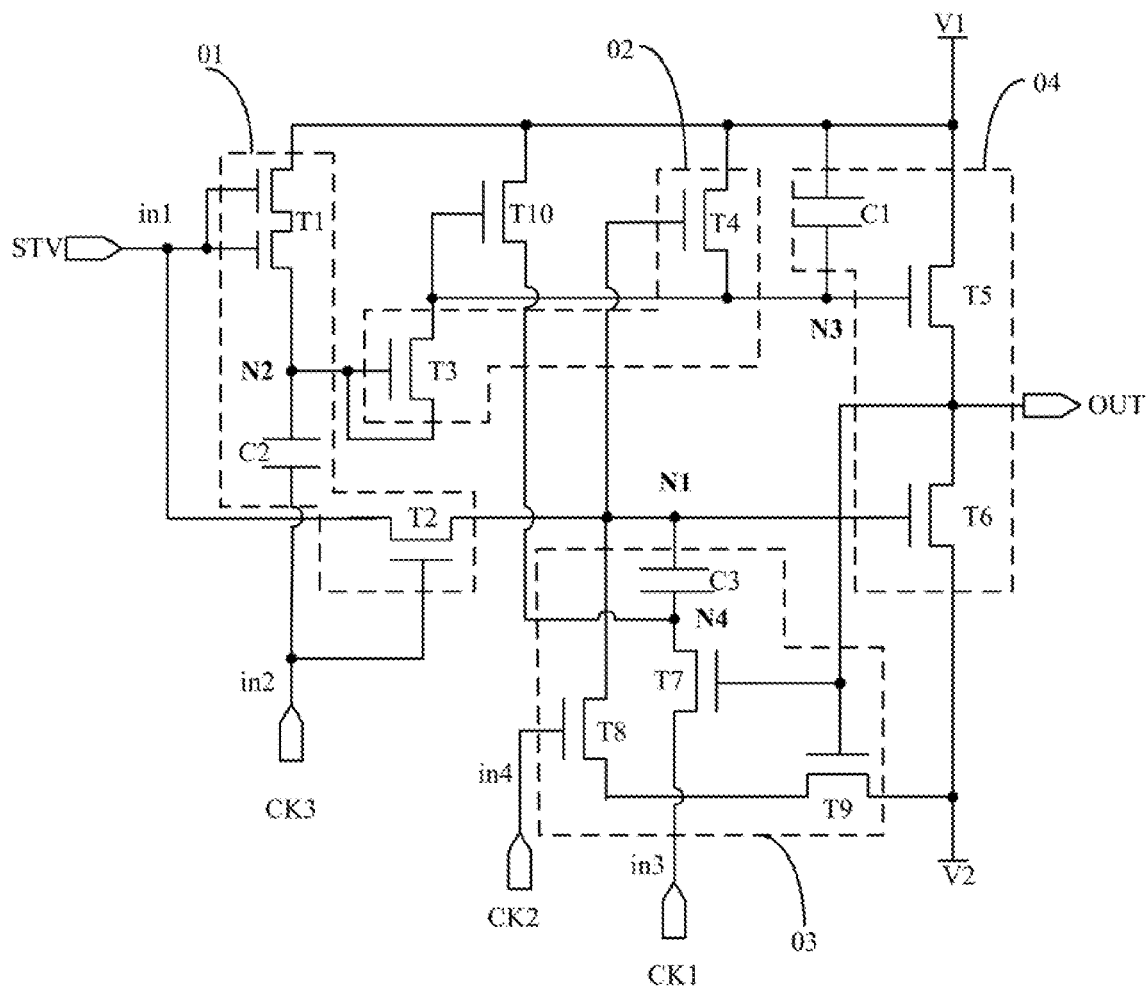
FIG. 7B is a schematic structural diagram of a further shift register element according to an embodiment of the disclosure.
Figure 7C:
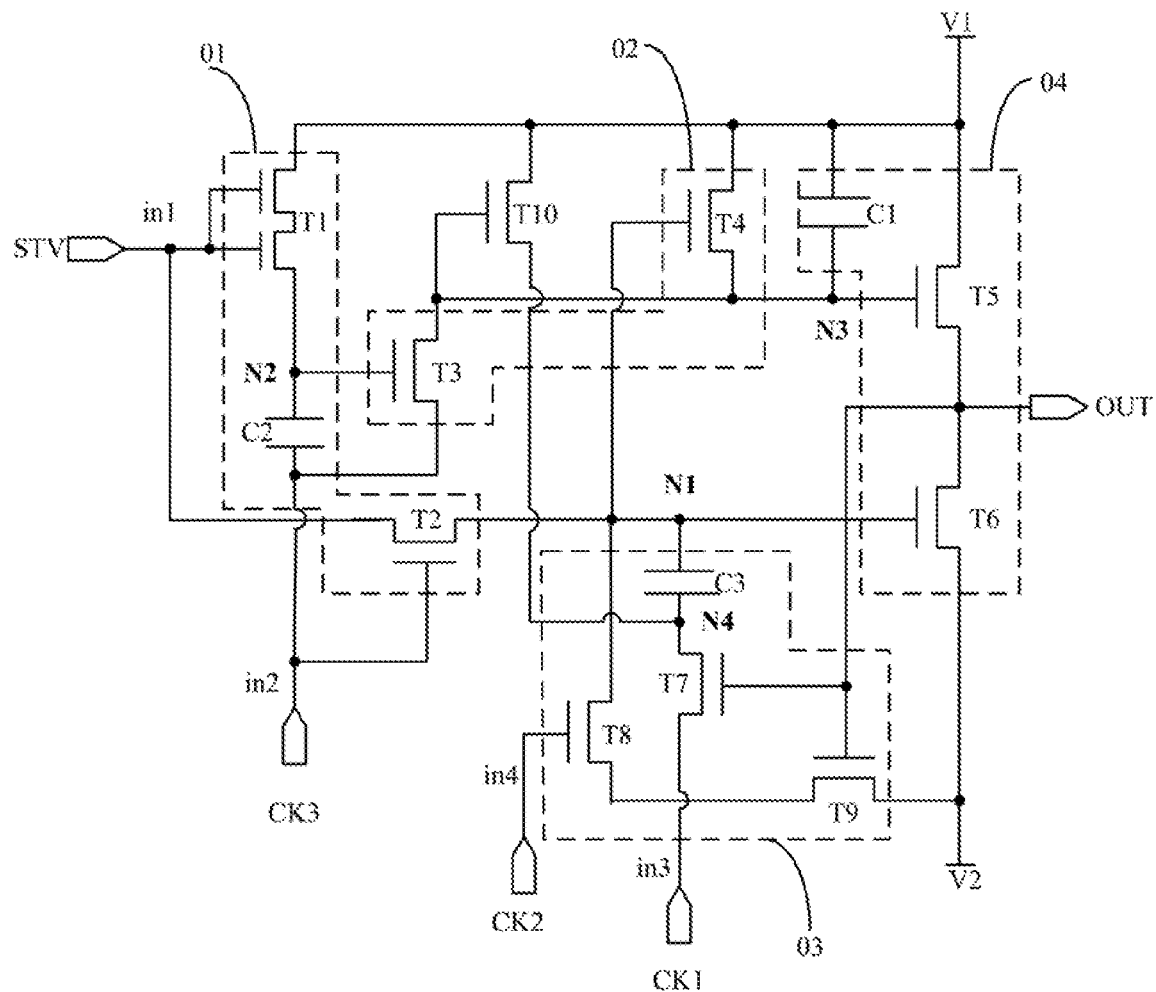
FIG. 7C is a schematic structural diagram of a further shift register element according to an embodiment of the disclosure.

Optionally in a shift register element according to an embodiment of the disclosure, as illustrated in FIG. 6A to FIG. 7C, FIG. 6A is a schematic structural diagram of a further shift register element according to an embodiment of the disclosure; FIG. 6B is a schematic structural diagram of a further shift register element according to an embodiment of the disclosure; FIG. 6C is a schematic structural diagram of a further shift register element according to an embodiment of the disclosure; FIG. 7A is a schematic structural diagram of a further shift register element according to an embodiment of the disclosure; FIG. 7B is a schematic structural diagram of a further shift register element according to an embodiment of the disclosure; and FIG. 7C is a schematic structural diagram of a further shift register element according to an embodiment of the disclosure, where the shift register element further includes followings.

A tenth transistor T10 configured to provide the fourth node N4 with the voltage of the first signal terminal V1 according to the voltage of the third node N3.

Optionally in a shift register element according to an embodiment of the disclosure, as illustrated in FIG. 6A to FIG. 7C, the tenth transistor T10 has a gate connected with the third node N3, a first pole connected with the first signal terminal V1, and a second pole connected with the fourth node N4.

Optionally if the tenth transistor is controlled by the third node to be switched on, then it will provide the fourth node with the signal of the first signal terminal; and if the potential of the third node is a low potential, then the tenth transistor will maintain the potential of the fourth node at a high potential to thereby avoid the fourth node from floating so as to enable the potential of the first node to be a high potential, thus further enabling the circuit to output stably.

Optionally in order to make a fabrication process uniform, in a shift register element according to an embodiment of the disclosure, as illustrated in FIG. 5A to FIG. 6C, all the transistors are P-type transistors, or as illustrated in FIG. 7A to FIG. 7C, all the transistors are N-type transistors.

Optionally in a shift register element according to an embodiment of the disclosure, an N-type transistor is switched on by a high-potential signal, and switched off by a low-potential signal; and a P-type transistor is switched on by a low-potential signal, and switched off by a high-potential signal.

Optionally in a shift register element according to an embodiment of the disclosure, a first pole of a transistor may be a source, and a second pole thereof may be a drain; or a first pole of a transistor may be a drain, and a second pole thereof may be a source, although embodiments of the disclosure will not be limited thereto.

It shall be noted that in a shift register element according to an embodiment of the disclosure, if all the transistors are P-type transistors, then the signal of the first signal terminal will be a high-potential signal, and the signal of the second signal terminal will be a low-potential signal; and if all the transistors are N-type transistors, then the signal of the first signal terminal will be a low-potential signal, and the signal of the second signal terminal will be a high-potential signal.

Optionally in a shift register element according to an embodiment of the disclosure, any transistor may be arranged in a dual-gate structure in order to alleviate leakage current, although embodiments of the disclosure will not be limited thereto.

An operating process of a shift register element according to an embodiment of the disclosure will be described below with reference to a circuit timing diagram. In the following description, 1 represents a high potential, and 0 represents a low potential. It shall be noted that 1 and 0 represent logic levels, and are only intended to better set forth a particular operating process according to an embodiment of the disclosure, but not to be limited to any particular voltage values.

First Example

Figure 8A:
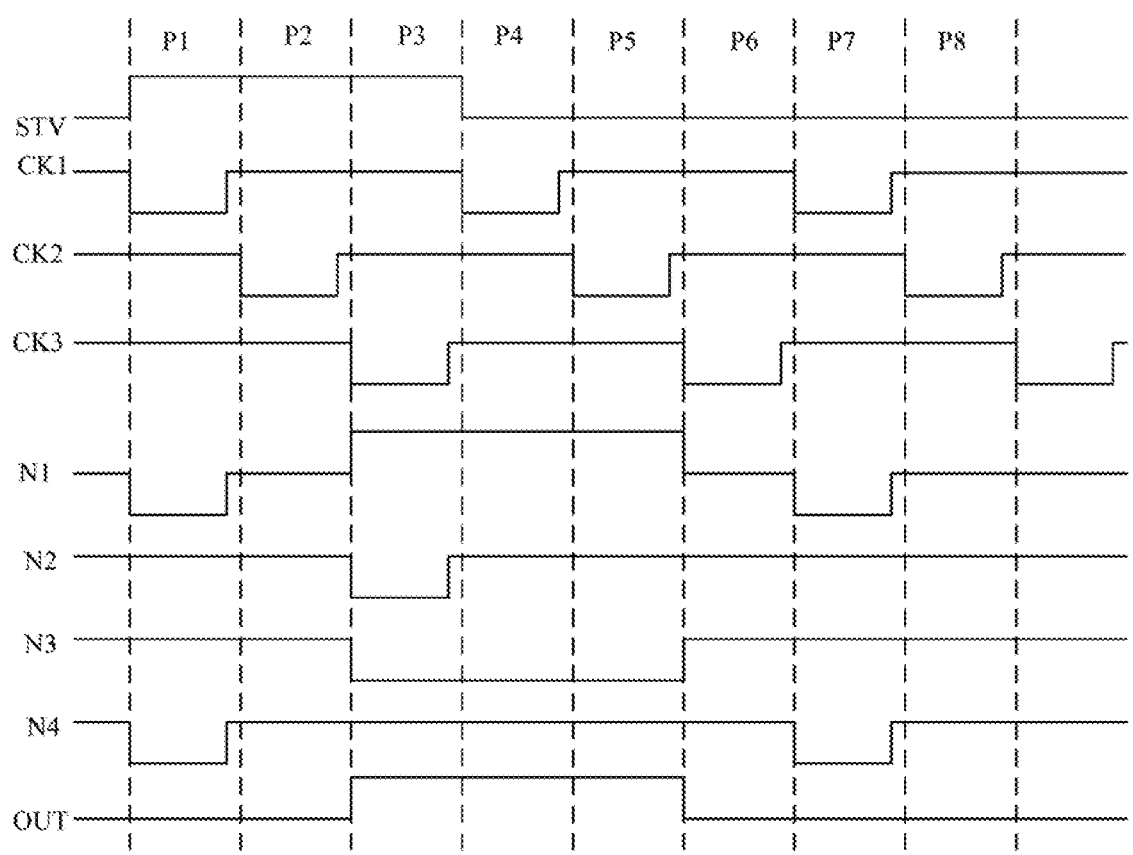
FIG. 8A is an input-output timing diagram corresponding to a shift register element according to an embodiment of the disclosure.

Taking the shift register element as illustrated in FIG. 5A to FIG. 5C as an example, all the transistors in the shift register element are P-type transistors, and FIG. 8A illustrates an input-output timing diagram corresponding to a shift register element according to an embodiment of the disclosure; and optionally there are eight selected stages P1, P2, P3, P4, P5, P6, P7, and P8 in the input-output timing diagram as illustrated in FIG. 8A.

In the P1 stage, STV=1, CK1=0, CK2=1, and CK3=1.

With STV=1, the first transistor T1 is switched off. With CK2=1, the eighth transistor T8 is switched off. With CK3=1, the second transistor T2 is switched off. The potential of the second node N2 is maintained at a high potential due to the action of the second capacitor C2, and the third transistor T3 is switched off. The first node N1 is maintained at a low potential of the preceding stage due to the action of the third capacitor C3. The sixth transistor T6 and the fourth transistor T4 are switched on, and the low-potential signal of the second signal terminal V2 is transmitted to the output terminal OUT through the sixth transistor T6, so the output terminal OUT is at a low potential. Also the seventh transistor T7 and the ninth transistor T9 are controlled by the output terminal OUT to be switched on, so that the seventh transistor T7 transmits the first clock signal CK1 to the fourth node N4, the potential of the fourth node N4 is changed to a low potential, and the potential of the first node N1 is further pulled down by the coupling third capacitor C3, so that the entire low-potential signal of the second signal terminal V2 can be output to the output terminal OUT. Also the high-potential signal of the first signal terminal V1 is transmitted to the third node N3 through the fourth transistor T4, and the potential of the third node N3 is a high potential, so that the fifth transistor T5 is switched off.

In the P2 stage, STV=1, CK1=1, CK2=0, and CK3=1.

With STV=1, the first transistor T1 is switched off. With CK3=1, the second transistor T2 is switched off. The potential of the second node N2 is maintained at a high potential due to the action of the second capacitor C2, and the third transistor T3 is switched off. With CK2=0, the eighth transistor T8 is switched on. The first node N1 is still maintained at a low potential of the preceding stage due to the action of the third capacitor C3. The sixth transistor T6 and the fourth transistor T4 are switched on, and the low-potential signal of the second signal terminal V2 is transmitted to the output terminal OUT through the sixth transistor T6, so the output terminal OUT is at a low potential. Also the seventh transistor T7 and the ninth transistor T9 are controlled by the output terminal OUT to be switched on, so that the seventh transistor T7 transmits the first clock signal CK1 to the fourth node N4, the potential of the fourth node N4 is changed to a high potential. Also the low-potential signal of the second signal terminal V2 is transmitted to the first node N1 through the eighth transistor T8 and the ninth transistor T9 to thereby avoid the first node N1 from floating so as to stabilize the potential of the first node N1. Furthermore the high-potential signal of the first signal terminal V1 is transmitted to the third node N3 through the fourth transistor T4, and the potential of the third node N3 is a high potential, so that the fifth transistor T5 is switched off.

In the P3 stage, STV=1, CK1=1, CK2=1, and CK3=0.

With STV=1, the first transistor T1 is switched off. With CK2=1, the eighth transistor T8 is switched off. With CK3=0, the second transistor T2 is switched on. The start signal STV at a high potential is transmitted to the first node N1 through the second transistor T2, and the potential of the first node N1 is changed to a high potential. The sixth transistor T6 and the fourth transistor T4 are switched off. Since the third clock signal CK3 is changed from a high potential of the preceding stage to a low potential, the potential of the second node N2 is also changed to a low potential due to the action of the second capacitor C2, and the third transistor T3 is switched on. The signal of the second signal terminal V2 (in the shift register element in FIG. 5A) or the third clock signal CK3 (in the shift register element in FIG. 5C) or the second node N2 (in the shift register element in FIG. 5B) at a low potential is transmitted to the third node N3 through the third transistor T3, the potential of the third node N3 is changed to a low potential, and the fifth transistor T5 is switched on. The high-potential signal of the first signal terminal V1 is transmitted to the output terminal OUT through the fifth transistor T5, so the output terminal OUT is at a high potential. Also the seventh transistor T7 and the ninth transistor T9 are controlled by the output terminal OUT to be switched off.

In the P4 stage, STV=0, CK1=0, CK2=1, and CK3=1.

With STV=0, the first transistor T1 is switched on. With CK2=1, the eighth transistor T8 is switched off. With CK3=1, the second transistor T2 is switched off. The high-potential signal of the first signal terminal V1 is transmitted to the second node N2 through the first transistor T1, the second node N2 is at a high potential, and the third transistor T3 is switched off. The third node N3 is maintained at a low potential due to the action of the first capacitor C1, and the fifth transistor T5 is switched on. The high-potential signal of the first signal terminal V1 is transmitted to the output terminal OUT through the fifth transistor T5, so the output terminal OUT is at a high potential. Also the seventh transistor T7 and the ninth transistor T9 are controlled by the output terminal OUT to be switched off. The first node N1 and the fourth node N4 are still maintained at a high potential due to the action of the third capacitor C3, and the fourth transistor T4 is switched off.

In the P5 stage, STV=0, CK1=1, CK2=0, and CK3=1.

With STV=0, the first transistor T1 is switched on. With CK3=1, the second transistor T2 is switched off. With CK2=0, the eighth transistor T8 is switched on. The high-potential signal of the first signal terminal V1 is transmitted to the second node N2 through the first transistor T1, the second node N2 is at a high potential, and the third transistor T3 is switched off. The third node N3 is maintained at a low potential due to the action of the first capacitor C1, and the fifth transistor T5 is switched on. The high-potential signal of the first signal terminal V1 is transmitted to the output terminal OUT through the fifth transistor T5, so the output terminal OUT is at a high potential. Also the seventh transistor T7 and the ninth transistor T9 are controlled by the output terminal OUT to be switched off. The first node N1 and the fourth node N4 are still maintained at a high potential due to the action of the third capacitor C3, and the fourth transistor T4 is switched off.

In the P6 stage, STV=0, CK1=1, CK2=1, and CK3=0.

With STV=0, the first transistor T1 is switched on. With CK2=1, the eighth transistor T8 is switched off. With CK3=0, the second transistor T2 is switched on. The start signal STV at a low potential is transmitted to the first node N1 through the second transistor T2, and the potential of the first node N1 is changed to a low potential. The sixth transistor T6 and the fourth transistor T4 are switched on. The low-potential signal of the second signal terminal V2 is transmitted to the output terminal OUT through the sixth transistor T6, so the output terminal OUT is at a low potential. Also the seventh transistor T7 and the ninth transistor T9 are controlled by the output terminal OUT to be switched on, so that the seventh transistor T7 transmits the first clock signal CK1 to the fourth node N4, and the potential of the fourth node N4 is changed to a high potential. Furthermore the high-potential signal of the first signal terminal V1 is transmitted to the third node N3 through the fourth transistor T4, and the potential of the third node N3 is a high potential, so that the fifth transistor T5 is switched off. The high-level signal of the first signal terminal V1 is transmitted to the second node N2 through the first transistor T1, the second node N2 is at a high potential, and the third transistor T3 is switched off.

In the P7 stage, STV=0, CK1=0, CK2=1, and CK3=1.

With STV=0, the first transistor T1 is switched on. With CK2=1, the eighth transistor T8 is switched off. With CK3=1, the second transistor T2 is switched off. The high-potential signal of the first signal terminal V1 is transmitted to the second node N2 through the first transistor T1, the second node N2 is at a high potential, and the third transistor T3 is switched off. The first node N1 is maintained at a low potential of the preceding stage due to the action of the third capacitor C3. The sixth transistor T6 and the fourth transistor T4 are switched on, and the low-potential signal of the second signal terminal V2 is transmitted to the output terminal OUT through the sixth transistor T6, so the output terminal OUT is at a low potential. Also the seventh transistor T7 and the ninth transistor T9 are controlled by the output terminal OUT to be switched on, so that the seventh transistor T7 transmits the first clock signal CK1 to the fourth node N4, the potential of the fourth node N4 is changed to a low potential, and the potential of the first node N1 is further pulled down by the coupling third capacitor C3, so that the entire low-potential signal of the second signal terminal V2 can be output to the output terminal OUT. Also the high-potential signal of the first signal terminal V1 is transmitted to the third node N3 through the fourth transistor T4, and the potential of the third node N3 is a high potential, so that the fifth transistor T5 is switched off.

In the P8 stage, STV=0, CK1=1, CK2=0, and CK3=1.

With STV=0, the first transistor T1 is switched on. With CK3=1, the second transistor T2 is switched off. The high-potential signal of the first signal terminal V1 is transmitted to the second node N2 through the first transistor T1, the second node N2 is at a high potential, and the third transistor T3 is switched off. With CK2=0, the eighth transistor T8 is switched on. The first node N1 is still maintained at a low potential due to the action of the third capacitor C3. The sixth transistor T6 and the fourth transistor T4 are switched on, and the low-potential signal of the second signal terminal V2 is transmitted to the output terminal OUT through the sixth transistor T6, so the output terminal OUT is at a low potential. Also the seventh transistor T7 and the ninth transistor T9 are controlled by the output terminal OUT to be switched on, so that the seventh transistor T7 transmits the first clock signal CK1 to the fourth node N4, the potential of the fourth node N4 is changed to a high potential. Also the low-potential signal of the second signal terminal V2 is transmitted to the first node N1 through the eighth transistor T8 and the ninth transistor T9 to thereby avoid the first node N1 from floating so as to stabilize the potential of the first node N1. Furthermore the high-potential signal of the first signal terminal V1 is transmitted to the third node N3 through the fourth transistor T4, and the potential of the third node N3 is a high potential, so that the fifth transistor T5 is switched off.

Thereafter the shift register element keeps on operating repeatedly in the T6 to T8 stages until the start signal is changed to be a high-potential signal in the next frame. If the output terminal of the shift register element is flipped from the low potential, then the potentials of the third node and the first node will not be affected by the signal of the output terminal, so that there will be no contention between the potentials of the nodes, thus improving the stability of the circuit; and the first node can be performed with the feedback regulation using the signal of the output terminal to thereby shorten a period of time for which the node is floating, so as to further improve the stability of the circuit.

Second Example

Taking the shift register element as illustrated in FIG. 6A to FIG. 6C as an example, all the transistors in the shift register element are P-type transistors, and FIG. 8A illustrates an input-output timing diagram corresponding to a shift register element according to an embodiment of the disclosure; and optionally there are eight selected stages P1, P2, P3, P4, P5, P6, P7, and P8 in the input-output timing diagram as illustrated in FIG. 8A.

In the P1 stage, STV=1, CK1=0, CK2=1, and CK3=1.

In this stage, the tenth transistor T10 is controlled by the third node N3 to be switched off. The operating process of the shift register element is the same as in the P1 stage in the first example, so a repeated description thereof will be omitted here.

In the P2 stage, STV=1, CK1=1, CK2=0, and CK3=1.

In this stage, the tenth transistor T10 is controlled by the third node N3 to be switched off. The operating process of the shift register element is the same as in the P2 stage in the first example, so a repeated description thereof will be omitted here.

In the P3 stage, STV=1, CK1=1, CK2=1, and CK3=0.

As compared with the first example, in this stage, the tenth transistor T10 is controlled by the third node N3 to be switched on, and the high-potential signal of the first signal terminal V1 is transmitted to the fourth node N1 through the tenth transistor T10, thus further enabling the potential of the first node N1 to be a high potential. The operating process of the other transistors is the same as in the P3 stage in the first example, so a repeated description thereof will be omitted here.

In the P4 stage, STV=0, CK1=0, CK2=1, and CK3=1.

As compared with the first example, in this stage, the tenth transistor T10 is controlled by the third node N3 to be switched on, and the high-potential signal of the first signal terminal V1 is transmitted to the fourth node N1 through the tenth transistor T10, thus further enabling the potential of the first node N1 to be a high potential. The operating process of the other transistors is the same as in the P4 stage in the first example, so a repeated description thereof will be omitted here.

In the P5 stage, STV=0, CK1=1, CK2=0, and CK3=1.

As compared with the first example, in this stage, the tenth transistor T10 is controlled by the third node N3 to be switched on, and the high-potential signal of the first signal terminal V1 is transmitted to the fourth node N1 through the tenth transistor T10, thus further enabling the potential of the first node N1 to be a high potential. The operating process of the other transistors is the same as in the P5 stage in the first example, so a repeated description thereof will be omitted here.

In the P6 stage, STV=0, CK1=1, CK2=1, and CK3=0.

In this stage, the tenth transistor T10 is controlled by the third node N3 to be switched off. The operating process of the shift register element is the same as in the P6 stage in the first example, so a repeated description thereof will be omitted here.

In the P7 stage, STV=0, CK1=0, CK2=1, and CK3=1.

In this stage, the tenth transistor T10 is controlled by the third node N3 to be switched off. The operating process of the shift register element is the same as in the P7.

In the P8 stage, STV=0, CK1=1, CK2=0, and CK3=1.

In this stage, the tenth transistor T10 is controlled by the third node N3 to be switched off. The operating process of the shift register element is the same as in the P8.

As compared with the first example, the tenth transistor is additionally arranged so that if a high potential is output at the output terminal, then the potential of the first node will be controlled using the tenth transistor to thereby further enable the potential of the first node to be a high potential so as to improve the stability of the circuit, thus extending a process window.

Third Example

Figure 8B:
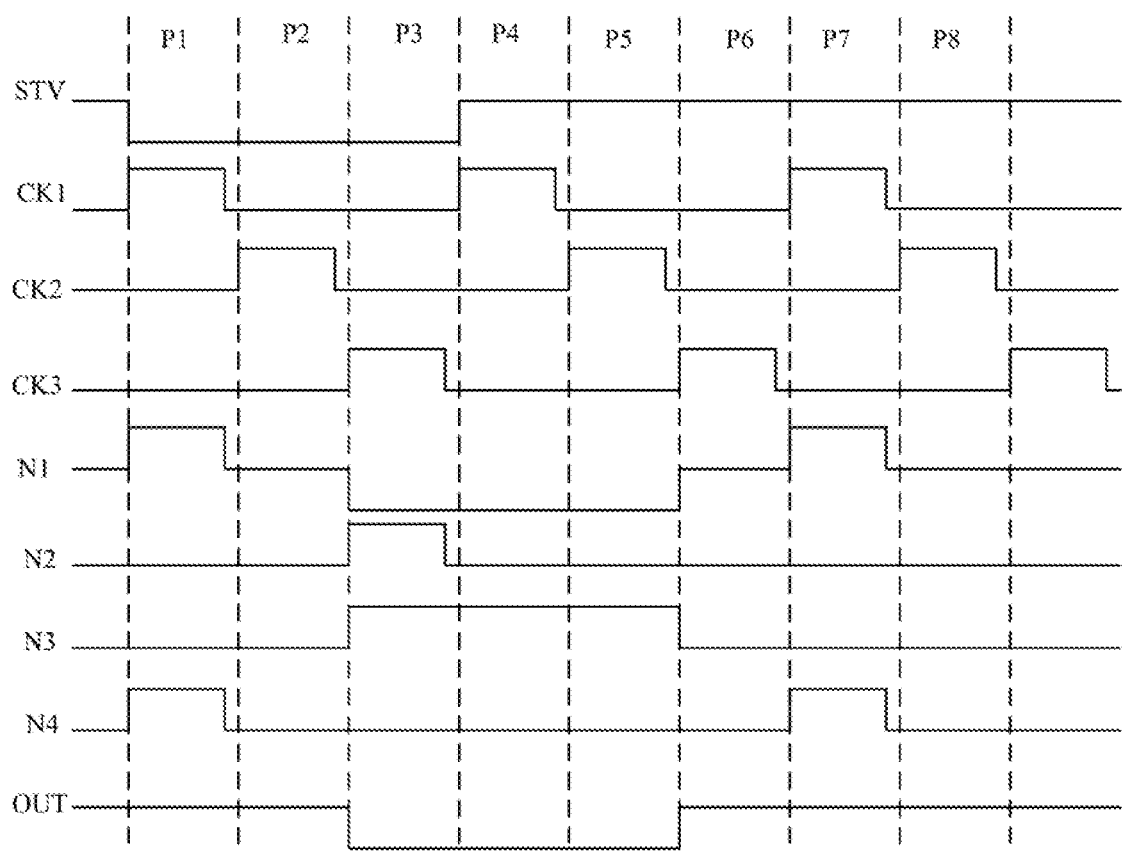
FIG. 8B is another input-output timing diagram corresponding to a shift register element according to an embodiment of the disclosure.

Taking the shift register element as illustrated in FIG. 7A to FIG. 7C as an example, all the transistors in the shift register element are N-type transistors, and FIG. 8B illustrates another input-output timing diagram corresponding to a shift register element according to an embodiment of the disclosure; and optionally there are eight selected stages P1, P2, P3, P4, P5, P6, P7, and P8 in the input-output timing diagram as illustrated in FIG. 8B.

In the P1 stage, STV=0, CK1=1, CK2=0, and CK3=0.

With STV=0, the first transistor T1 is switched off. With CK2=0, the eighth transistor T8 is switched off. With CK3=0, the second transistor T2 is switched off. The potential of the second node N2 is maintained at a low potential due to the action of the second capacitor C2, and the third transistor T3 is switched off. The first node N1 is maintained at a high potential of the preceding stage due to the action of the third capacitor C3. The sixth transistor T6 and the fourth transistor T4 are switched on, and the high-potential signal of the second signal terminal V2 is transmitted to the output terminal OUT through the sixth transistor T6, so the output terminal OUT is at a high potential. Also the seventh transistor T7 and the ninth transistor T9 are controlled by the output terminal OUT to be switched on, so that the seventh transistor T7 transmits the first clock signal CK1 to the fourth node N4, the potential of the fourth node N4 is changed to a high potential, and the potential of the first node N1 is further pulled up by the coupling third capacitor C3, so that the entire high-potential signal of the second signal terminal V2 can be output to the output terminal OUT. Also the low-potential signal of the first signal terminal V1 is transmitted to the third node N3 through the fourth transistor T4, and the potential of the third node N3 is a low potential, so that the fifth transistor T5 and the tenth transistor T10 are switched off.

In the P2 stage, STV=0, CK1=0, CK2=1, and CK3=0.

With STV=0, the first transistor T1 is switched off. With CK3=0, the second transistor T2 is switched off. The potential of the second node N2 is maintained at a low potential due to the action of the second capacitor C2, and the third transistor T3 is switched off. With CK2=1, the eighth transistor T8 is switched on. The first node N1 is still at a high potential due to the action of the third capacitor C3. The sixth transistor T6 and the fourth transistor T4 are switched on, and the high-potential signal of the second signal terminal V2 is transmitted to the output terminal OUT through the sixth transistor T6, so the output terminal OUT is at a high potential. Also the seventh transistor T7 and the ninth transistor T9 are controlled by the output terminal OUT to be switched on, so that the seventh transistor T7 transmits the first clock signal CK1 to the fourth node N4, the potential of the fourth node N4 is changed to a low potential. Also the high-potential signal of the second signal terminal V2 is transmitted to the first node N1 through the eighth transistor T8 and the ninth transistor T9 to thereby avoid the first node N1 from floating so as to stabilize the potential of the first node N1. Furthermore the low-potential signal of the first signal terminal V1 is transmitted to the third node N3 through the fourth transistor T4, and the potential of the third node N3 is a low potential, so that the fifth transistor T5 and the tenth transistor T10 are switched off.

In the P3 stage, STV=0, CK1=0, CK2=0, and CK3=1.

With STV=0, the first transistor T1 is switched off. With CK2=0, the eighth transistor T8 is switched off. With CK3=1, the second transistor T2 is switched on. The start signal STV at a low potential is transmitted to the first node N1 through the second transistor T2, and the potential of the first node N1 is changed to a low potential. The sixth transistor T6 and the fourth transistor T4 are switched off. Since the third clock signal CK3 is changed from a low potential of the preceding stage to a high potential, the potential of the second node N2 is also changed to a high potential due to the action of the second capacitor C2, and the third transistor T3 is switched on. The signal of the second signal terminal V2 (in the shift register element in FIG. 7A) or the third clock signal CK3 (in the shift register element in FIG. 7C) or the second node N2 (in the shift register element in FIG. 7B) at a high potential is transmitted to the third node N3 through the third transistor T3, the potential of the third node N3 is changed to a high potential, and the fifth transistor T5 is switched on. The low-potential signal of the first signal terminal V1 is transmitted to the output terminal OUT through the fifth transistor T5, so the output terminal OUT is at a low potential. Also the seventh transistor T7 and the ninth transistor T9 are controlled by the output terminal OUT to be switched off.

In this stage, the tenth transistor T10 is controlled by the third node N3 to be switched on, and the low-potential signal of the first signal terminal V1 is transmitted to the fourth node N1 through the tenth transistor T10, thus further enabling the potential of the first node N1 to be a low potential.

In the P4 stage, STV=1, CK1=1, CK2=0, and CK3=0.

With STV=1, the first transistor T1 is switched on. With CK2=0, the eighth transistor T8 is switched off. With CK3=0, the second transistor T2 is switched off. The low-potential signal of the first signal terminal V1 is transmitted to the second node N2 through the first transistor T1, the second node N2 is at a low potential, and the third transistor T3 is switched off. The third node N3 is maintained at a high potential due to the action of the first capacitor C1, and the fifth transistor T5 is switched on. The low-potential signal of the first signal terminal V1 is transmitted to the output terminal OUT through the fifth transistor T5, so the output terminal OUT is at a low potential. Also the seventh transistor T7 and the ninth transistor T9 are controlled by the output terminal OUT to be switched off. The first node N1 and the fourth node N4 are still maintained at a low potential due to the action of the third capacitor C3, and the fourth transistor T4 is switched off.

In this stage, the tenth transistor T10 is controlled by the third node N3 to be switched on, and the low-potential signal of the first signal terminal V1 is transmitted to the fourth node N1 through the tenth transistor T10, thus further enabling the potential of the first node N1 to be a low potential.

In the P5 stage, STV=1, CK1=0, CK2=1, and CK3=0.

With STV=1, the first transistor T1 is switched on. With CK3=0, the second transistor T2 is switched off. With CK2=1, the eighth transistor T8 is switched on. The low-potential signal of the first signal terminal V1 is transmitted to the second node N2 through the first transistor T1, the second node N2 is at a low potential, and the third transistor T3 is switched off. The third node N3 is maintained at a high potential due to the action of the first capacitor C1, and the fifth transistor T5 is switched on. The low-potential signal of the first signal terminal V1 is transmitted to the output terminal OUT through the fifth transistor T5, so the output terminal OUT is at a low potential. Also the seventh transistor T7 and the ninth transistor T9 are controlled by the output terminal OUT to be switched off. The first node N1 and the fourth node N4 are still maintained at a low potential due to the action of the third capacitor C3, and the fourth transistor T4 is switched off.

In this stage, the tenth transistor T10 is controlled by the third node N3 to be switched on, and the low-potential signal of the first signal terminal V1 is transmitted to the fourth node N1 through the tenth transistor T10, thus further enabling the potential of the first node N1 to be a low potential.

In the P6 stage, STV=1, CK1=0, CK2=0, and CK3=1.

With STV=1, the first transistor T1 is switched on. With CK2=0, the eighth transistor T8 is switched off. With CK3=1, the second transistor T2 is switched on. The start signal STV at a high potential is transmitted to the first node N1 through the second transistor T2, and the potential of the first node N1 is changed to a high potential. The sixth transistor T6 and the fourth transistor T4 are switched on. The high-potential signal of the second signal terminal V2 is transmitted to the output terminal OUT through the sixth transistor T6, so the output terminal OUT is at a high potential. Also the seventh transistor T7 and the ninth transistor T9 are controlled by the output terminal OUT to be switched on, so that the seventh transistor T7 transmits the first clock signal CK1 to the fourth node N4, and the potential of the fourth node N4 is changed to a low potential. Furthermore the low-potential signal of the first signal terminal V1 is transmitted to the third node N3 through the fourth transistor T4, and the potential of the third node N3 is a low potential, so that the fifth transistor T5 and the tenth transistor T10 are switched off. The low-level signal of the first signal terminal V1 is transmitted to the second node N2 through the first transistor T1, the second node N2 is at a low potential, and the third transistor T3 is switched off.

In the P7 stage, STV=1, CK1=1, CK2=0, and CK3=0.

With STV=1, the first transistor T1 is switched on. With CK2=0, the eighth transistor T8 is switched off. With CK3=0, the second transistor T2 is switched off. The low-potential signal of the first signal terminal V1 is transmitted to the second node N2 through the first transistor T1, the second node N2 is at a low potential, and the third transistor T3 is switched off. The first node N1 is maintained at a high potential of the preceding stage due to the action of the third capacitor C3. The sixth transistor T6 and the fourth transistor T4 are switched on, and the high-potential signal of the second signal terminal V2 is transmitted to the output terminal OUT through the sixth transistor T6, so the output terminal OUT is at a high potential. Also the seventh transistor T7 and the ninth transistor T9 are controlled by the output terminal OUT to be switched on, so that the seventh transistor T7 transmits the first clock signal CK1 to the fourth node N4, the potential of the fourth node N4 is changed to a high potential, and the potential of the first node N1 is further pulled up by the coupling third capacitor C3, so that the entire high-potential signal of the second signal terminal V2 can be output to the output terminal OUT. Also the low-potential signal of the first signal terminal V1 is transmitted to the third node N3 through the fourth transistor T4, and the potential of the third node N3 is a low potential, so that the fifth transistor T5 and the tenth transistor T10 are switched off.

In the P8 stage, STV=1, CK1=0, CK2=1, and CK3=0.

With STV=1, the first transistor T1 is switched on. With CK3=0, the second transistor T2 is switched off. The low-potential signal of the first signal terminal V1 is transmitted to the second node N2 through the first transistor T1, the second node N2 is at a low potential, and the third transistor T3 is switched off. With CK2=1, the eighth transistor T8 is switched on. The first node N1 is still maintained at a high potential due to the action of the third capacitor C3. The sixth transistor T6 and the fourth transistor T4 are switched on, and the high-potential signal of the second signal terminal V2 is transmitted to the output terminal OUT through the sixth transistor T6, so the output terminal OUT is at a high potential. Also the seventh transistor T7 and the ninth transistor T9 are controlled by the output terminal OUT to be switched on, so that the seventh transistor T7 transmits the first clock signal CK1 to the fourth node N4, the potential of the fourth node N4 is changed to a low potential. Also the high-potential signal of the second signal terminal V2 is transmitted to the first node N1 through the eighth transistor T8 and the ninth transistor T9 to thereby avoid the first node N1 from floating so as to stabilize the potential of the first node N1. Furthermore the low-potential signal of the first signal terminal V1 is transmitted to the third node N3 through the fourth transistor T4, and the potential of the third node N3 is a low potential, so that the fifth transistor T5 and the tenth transistor T10 are switched off.

Thereafter the shift register element keeps on operating repeatedly in the T6 to T8 stages until the start signal is changed to be a high-potential signal in the next frame. If the output terminal of the shift register element is flipped from the low potential, then the potentials of the third node and the first node will not be affected by the signal of the output terminal, so that there will be no contention between the potentials of the nodes, thus improving the stability of the circuit; and the first node can be performed with feedback regulation using the signal of the output terminal to thereby shorten a period of time for which the node is floating, so as to further improve the stability of the circuit.

Furthermore the tenth transistor is arranged so that if a low level is output at the output terminal, then the potential of the first node will be controlled using the tenth transistor to thereby further enable the potential of the first node to be a low potential so as to improve the stability of the circuit, thus extending a process window.

Optionally in the shift register element according to the embodiment of the disclosure, since the fifth transistor and the sixth transistor are configured to output, the aspect ratios of channels in the fifth transistor and the sixth transistor are larger than those of the other transistors. Of the other transistors than the fifth transistor and the sixth transistor, the fourth transistor is configured to control the potential of the third node, and may have a smaller aspect ratio of a channel thereof, so that the fourth transistor can be avoided from being damaged due to a large voltage difference across the fourth transistor.

Furthermore in the shift register element according to embodiments of the disclosure, the first capacitor is configured to control the potential of the third node, and the third capacitor is configured to control the potential of the first node, so the capacitances of both the first capacitor and the third capacitor are typically more than 100 femtofarad in an implementation. The capacitance of the second capacitor can be less than that of the first capacitor.

Figure 9:
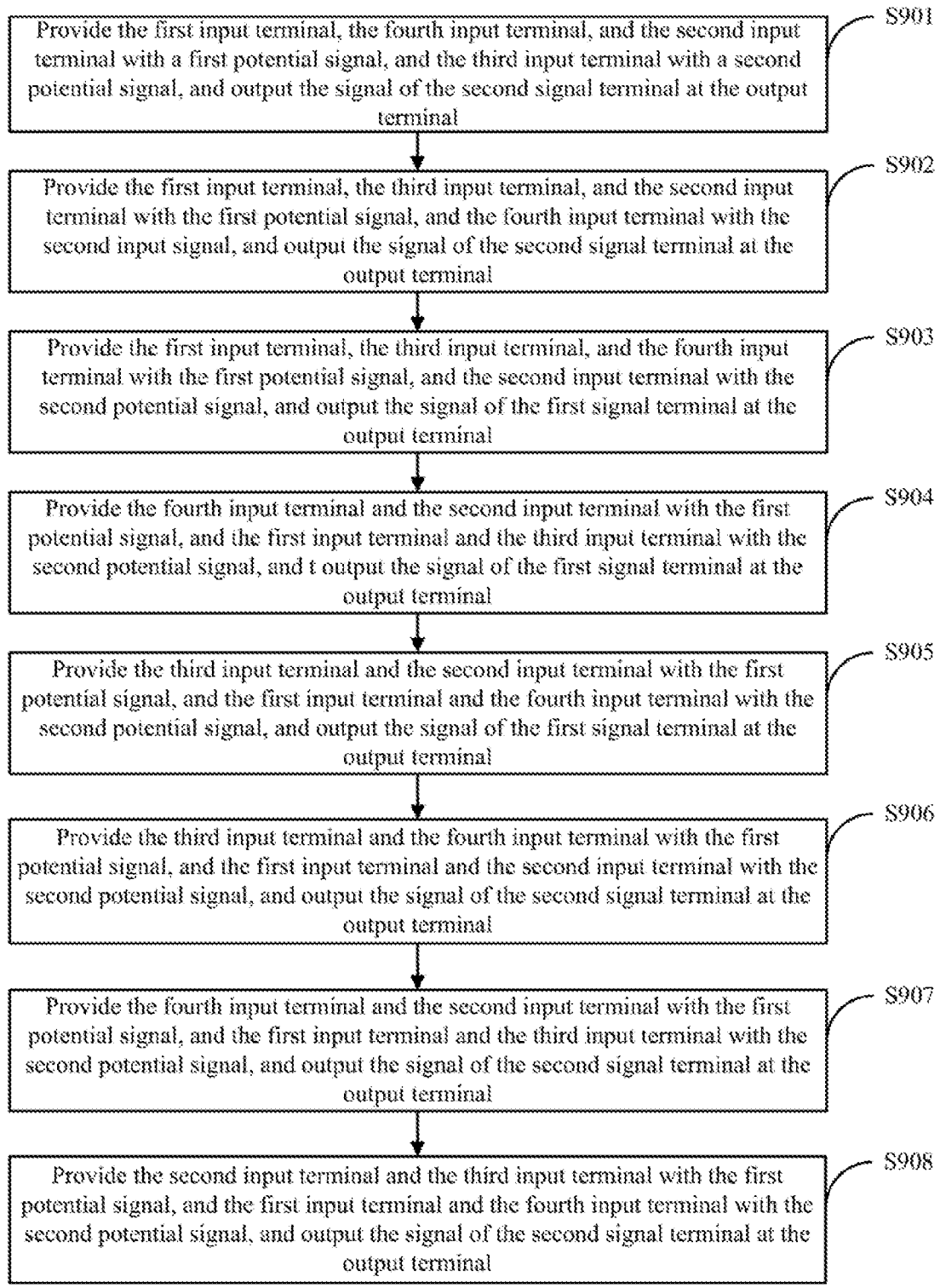
FIG. 9 is a schematic flow chart of a driving method according to an embodiment of the disclosure.

Based upon the same inventive idea, an embodiment of the disclosure further provides a method for driving the shift register element above, and FIG. 9 illustrates a schematic flow chart of a driving method according to an embodiment of the disclosure, where the method includes the following steps.

S901: a first stage of providing the first input terminal, the fourth input terminal, and the second input terminal with a first potential signal, and the third input terminal with a second potential signal, and outputting the signal of the second signal terminal at the output terminal.

S902: a second stage of providing the first input terminal, the third input terminal, and the second input terminal with the first potential signal, and the fourth input terminal with the second input signal, and outputting the signal of the second signal terminal at the output terminal.

S903: a third stage of providing the first input terminal, the third input terminal, and the fourth input terminal with the first potential signal, and the second input terminal with the second potential signal, and outputting the signal of the first signal terminal at the output terminal.

S904: a fourth stage of providing the fourth input terminal and the second input terminal with the first potential signal, and the first input terminal and the third input terminal with the second potential signal, and outputting the signal of the first signal terminal at the output terminal.

S905: a fifth stage of providing the third input terminal and the second input terminal with the first potential signal, and the first input terminal and the fourth input terminal with the second potential signal, and outputting the signal of the first signal terminal at the output terminal.

S906: a sixth stage of providing the third input terminal and the fourth input terminal with the first potential signal, and the first input terminal and the second input terminal with the second potential signal, and outputting the signal of the second signal terminal at the output terminal.

S907: a seventh stage of providing the fourth input terminal and the second input terminal with the first potential signal, and the first input terminal and the third input terminal with the second potential signal, and outputting the signal of the second signal terminal at the output terminal.

S908: an eighth stage of providing the second input terminal and the third input terminal with the first potential signal, and the first input terminal and the fourth input terminal with the second potential signal, and outputting the signal of the second signal terminal at the output terminal.

Optionally in the driving method according to embodiments of the disclosure as illustrated in FIG. 9, if the first potential signal is a high-potential signal, and the second potential signal is a low-potential signal, then reference can be made to the P1 to P8 stages in the first and second examples above for particular operating principles in the respective stages in the timing diagram as illustrated in FIG. 8A, so a repeated description thereof will be omitted here.

Optionally in the driving method according to embodiments of the disclosure as illustrated in FIG. 9, if the first potential signal is a low-potential signal, and the second potential signal is a high-potential signal, then reference can be made to the P1 to P8 stages in the third embodiment above for particular operating principles in the respective stages in the timing diagram as illustrated in FIG. 8B, so a repeated description thereof will be omitted here.

Figure 10:
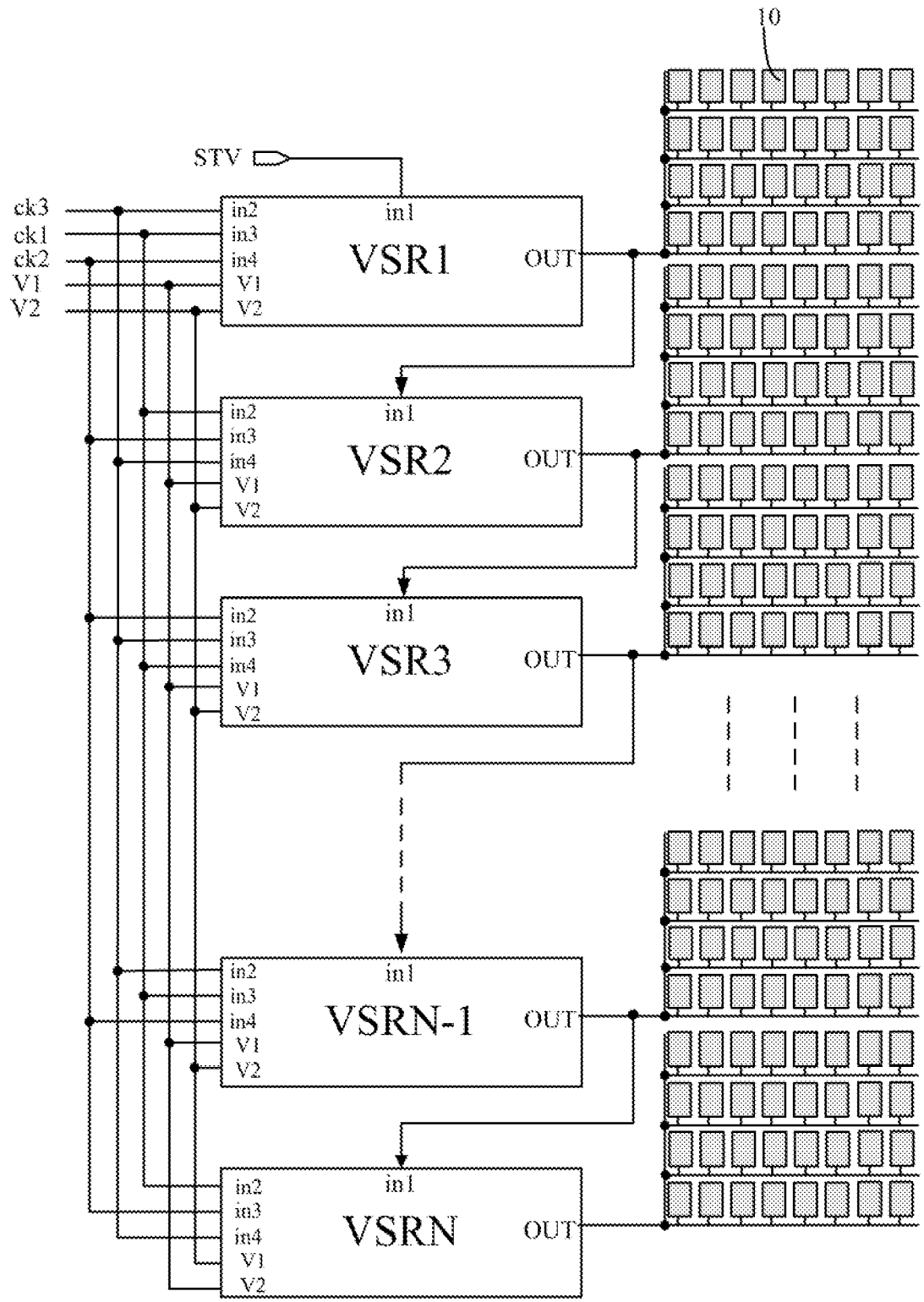
FIG. 10 is a schematic structural diagram of a display panel according to an embodiment of the disclosure.

Another embodiment of the disclosure further provides a display panel as illustrated in FIG. 10 which is a schematic structural diagram of a display panel according to an embodiment of the disclosure, where the display panel includes N shift register elements VSR1 to VSRN according to any one of the embodiments above of the disclosure, which are concatenated; and N represents an integer;

The first input terminal in1 of the first level of shift register element VSR1 is configured to receive the start signal STV.

The first input terminals in1 of the other levels of shift register elements VSRn than the first level of shift register element are connected with the output terminals OUT of their preceding levels of shift register elements VSRn−1.

The output terminal OUT of each level of shift register element VSRn other than the last level of shift register element VSRN is connected with the first input terminal in1 of its succeeding level of shift register element VSRn+1.

Optionally the display panel according to embodiments of the disclosure can be a mobile phone, a tablet computer, a TV set, a display, a notebook computer, a digital photo frame, a navigator, or any other product or component capable of displaying. Reference can be made to the embodiments above of the shift register element for an implementation of the display panel, so a repeated description thereof will be omitted here.

Optionally the display panel according to embodiments of the disclosure further includes three clock signal lines ck1, ck2, and ck3 as illustrated in FIG. 10.

The third input terminal in3 of the (3n+1)-th level of shift register element, the second input terminal in2 of the (3n+2)-th level of shift register element, and the fourth input terminal in4 of the (3n+3)-th level of shift register element are connected with the first clock signal line ck1.

The fourth input terminal in4 of the (3n+1)-th level of shift register element, the third input terminal in3 of the (3n+2)-th level of shift register element, and the second input terminal in2 of the (3n+3)-th level of shift register element are connected with the second clock signal line ck2.

The second input terminal in2 of the (3n+1)-th level of shift register element, the fourth input terminal in4 of the (3n+2)-th level of shift register element, and the third input terminal in3 of the (3n+3)-th level of shift register element are connected with the third clock signal line ck3.

Where n represents an integer, and n=0, 1, 2, 3, 4, . . . .

Optionally in the display panel according to embodiments of the disclosure, the respective levels of shift register elements can provide respective rows of gate lines in the display panel with scan signals, and of course, if the display panel is an organic light-emitting display panel, then the respective levels of shift register elements may provide their corresponding rows of pixels with light-emission control signals, although embodiments of the disclosure will not be limited thereto.

Optionally if the display panel according to embodiments of the disclosure is an organic light-emitting display panel, then the display panel may further include 4N rows of pixels 10 as illustrated in FIG. 10.

Figure 11:
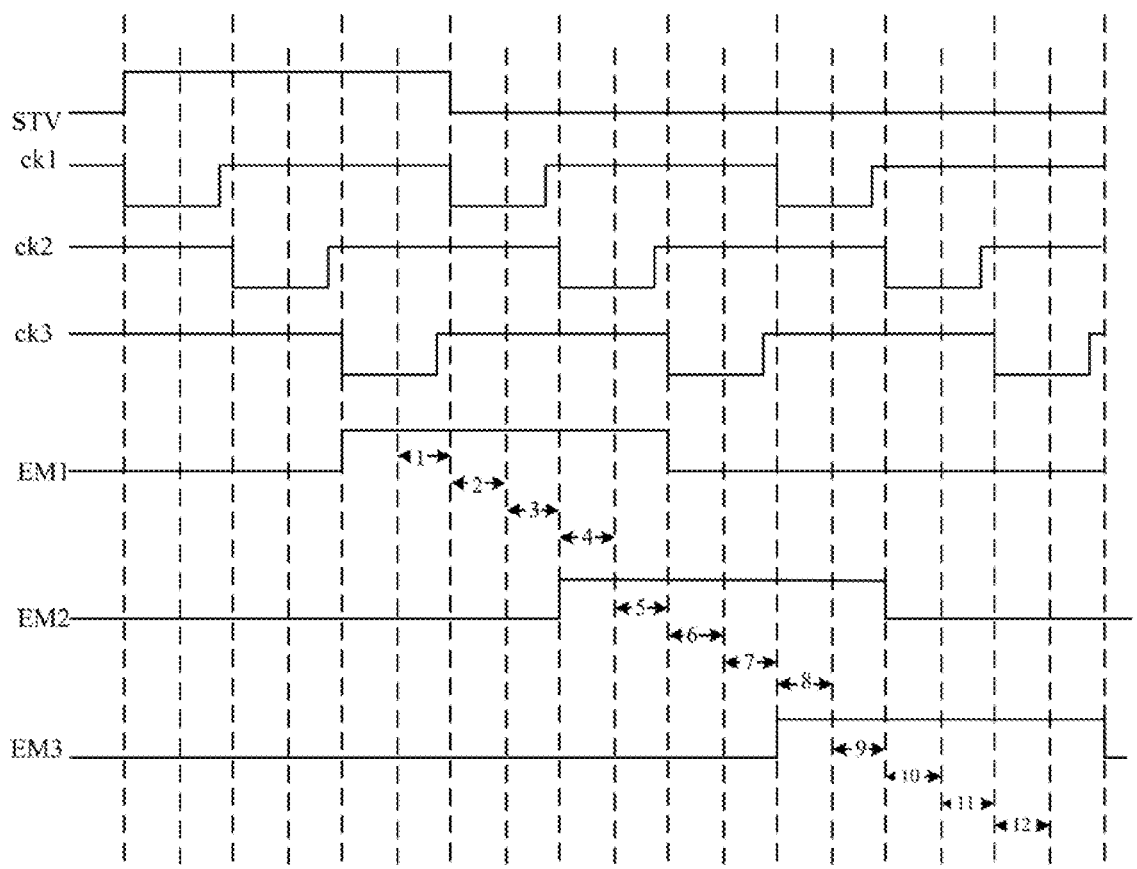
FIG. 11 is a timing diagram corresponding to the display panel according to the embodiment of the disclosure.

The output terminal of each level of shift register element is connected with four rows of pixels 10 so that the shift register element can transmit a light-emission control signal to the four rows of pixels 10 concurrently, optionally as illustrated in the timing diagram of FIG. 11 which is a timing diagram corresponding to the display panel according to embodiments of the disclosure. FIG. 11 illustrates the pixels emitting light when the light-emission control signal is at a low potential, and FIG. 11 only illustrates the light-emission control signals EM1, EM2, and EM3 output respectively at the output terminals of the first to third levels of shift register element, so that if the light-emission control signal EM1 output at the output terminal of the first level of shift register element is at a high potential, then data will be written sequentially into the first row of pixels to the fourth row of pixels after one sixth of a clock cycle, and if the light-emission control signal EM1 is at a low potential, then the first row of pixels to the fourth row of pixels will emit light concurrently. The same process will apply to the other levels of shift register elements, where 1 to 12 in FIG. 11 represents stages in which data are written into the first to twelfth rows of pixels respectively.

As compared with the existing display panel in which a row of pixels corresponds to a level of shift register element, each shift register element in the display panel according to embodiments of the disclosure can be connected with four rows of pixels to thereby reduce the number of shift register elements by a factor of ¾ given a number of rows of pixels in the display panel so as to greatly lower the width of an edge frame of the display panel.

Optionally since the first row of pixels in the display panel is arranged on the very edge of the display panel, and there may be a difference between the first row of pixels, and the other rows of pixels due to a process difference, the first row of pixels in the display panel can be arranged as dummy pixels in order to avoid a display abnormality at the first row of pixels due to the process difference.

In the shift register element, the method for driving the same, and the display panel according to the embodiments of the disclosure, the shift register element includes the output module configured to provide the output terminal with the signal of the first signal terminal or the second signal terminal according to the voltage applied to the first node and the third node, the first driver configured to control the voltage of the first node and the second node according to the signals of the first input terminal and the second input terminal, the second driver configured to control the voltage of the third node according to the voltage of the first node and the second node, and the feedback regulation module configured to control the voltage of the first node according to the signals of the output terminal, the third input terminal, and the fourth input terminal. Since the feedback regulation module can control the first node according to the output terminal, the potential of the first node can be better stabilized to thereby enable the circuit to output more stably.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

That which is claimed:

1. A shift register element, comprising:
an output module comprising a first node and a third node, wherein the output module is configured to provide an output terminal with a signal of a first signal terminal or a second signal terminal according to voltage applied to the first node and the third node;
a first driver configured to control voltage of the first node and voltage of a second node according to signals of a first input terminal and a second input terminal;
a second driver configured to control voltage of the third node according to the voltage of the first node and the second node; and
a feedback regulation module configured to control the voltage of the first node according to a signal of the output terminal, a signal of a third input terminal and a signal of a fourth input terminal;
wherein the first input terminal is configured to receive a start signal, or a signal output at an output terminal of a preceding level of shift register element;
wherein the second input terminal is configured to receive a third clock signal;
wherein the third input terminal is configured to receive a first clock signal; and
wherein the fourth input terminal is configured to receive a second clock signal.

2. The shift register element according to claim 1, wherein:
clock cycles for the first clock signal, the second clock signal, and the third clock signal are equal, and phases of the first clock signal, the second clock signal, and the third clock signal are different by one third of one of the clock cycles successively.

3. The shift register element according to claim 2, wherein:
the start signal lasts for one clock cycle.

4. The shift register element according to claim 3, wherein:
the start signal is a high-potential signal which is configured to be overlapping with low-potential signals of the first clock signal, the second clock signal and the third clock signal.

5. The shift register element according to claim 3, wherein:
the start signal is a low-potential signal which is configured to be overlapping with high-potential signals of the first clock signal, the second clock signal and the third clock signal.

6. The shift register element according to claim 1, wherein the first driver comprises a first transistor, a second transistor and a second capacitor;
wherein the first transistor has a gate connected with the first input terminal, a first pole connected with the first signal terminal, and a second pole connected with the second node;
wherein the second transistor has a gate connected with the second input terminal, a first pole connected with the first input terminal, and a second pole connected with the first node; and
wherein the second capacitor has one terminal connected with the second input terminal, and the other terminal connected with the second node.

7. The shift register element according to claim 6, wherein:
the first transistor is structured with dual gates.

8. The shift register element according to claim 1, wherein the second driver comprises a third transistor and a fourth transistor;
wherein the third transistor has a gate connected with the second node, wherein a first pole is connected with the second signal terminal, the second input terminal, or the second node, and wherein a second pole is connected with the third node; and
wherein the fourth transistor has a gate connected with the first node, a first pole connected with the first signal terminal, and a second pole connected with the third node.

9. The shift register element according to claim 1, wherein the output module comprises a fifth transistor, a sixth transistor, and a first capacitor;
wherein the fifth transistor has a gate connected with the third node, a first pole connected with the first signal terminal, and a second pole connected with the output terminal;

wherein the sixth transistor has a gate connected with the first node, a first pole connected with the second signal terminal, and a second pole connected with the output terminal; and wherein the first capacitor has one terminal connected with the first signal terminal, and the other terminal connected with the third node.

10. The shift register element according to claim 1, wherein the feedback regulation module comprises a seventh transistor, an eighth transistor, a ninth transistor, and a third capacitor;

wherein the seventh transistor has a gate connected with the output terminal, a first pole connected with the third input terminal, and a second pole connected with a fourth node;

wherein the eighth transistor has a gate connected with the fourth input terminal, a first pole connected with a second pole of the ninth transistor, and a second pole connected with the first node;

wherein the ninth transistor has a gate connected with the output terminal, and a first pole connected with the second signal terminal; and wherein the third capacitor has one terminal connected with the first node, and the other terminal connected with the fourth node.

11. The shift register element according to claim 10, further comprising:

a tenth transistor configured to provide the fourth node with the voltage of the first signal terminal according to the voltage of the third node.

12. The shift register element according to claim 11, wherein:

the tenth transistor has a gate connected with the third node, a first pole connected with the first signal terminal, and a second pole connected with the fourth node.

13. A method for driving the shift register element according to claim 1, the method comprising:

providing the first input terminal, the fourth input terminal and the second input terminal with a first potential signal, providing the third input terminal with a second potential signal, and outputting a signal of the second signal terminal at the output terminal;

providing the first input terminal, the third input terminal and the second input terminal with the first potential signal, providing the fourth input terminal with the second input signal, and outputting the signal of the second signal terminal at the output terminal;

providing the first input terminal, the third input terminal and the fourth input terminal with the first potential signal, providing the second input terminal with the second potential signal, and outputting the signal of the first signal terminal at the output terminal;

providing the fourth input terminal and the second input terminal with the first potential signal, providing the first input terminal and the third input terminal with the second potential signal, and outputting the signal of the first signal terminal at the output terminal;

providing the third input terminal and the second input terminal with the first potential signal, providing the first input terminal and the fourth input terminal with the second potential signal, and outputting the signal of the first signal terminal at the output terminal;

providing the third input terminal and the fourth input terminal with the first potential signal, providing the first input terminal and the second input terminal with the second potential signal, and outputting the signal of the second signal terminal at the output terminal;

providing the fourth input terminal and the second input terminal with the first potential signal, providing the first input terminal and the third input terminal with the second potential signal, and outputting the signal of the second signal terminal at the output terminal; and providing the second input terminal and the third input terminal with the first potential signal, providing the first input terminal and the fourth input terminal with the second potential signal, and outputting the signal of the second signal terminal at the output terminal.

14. A display panel, comprising N concatenated shift register elements, each of which is the shift register element according to claim 1, and N representing an integer, wherein:

the first input terminal of a first level of said shift register element is configured to receive the start signal;

the first input terminals of the other levels of said shift register element other than the first level of said shift register element are connected with output terminals of their preceding levels of said shift register element; and an output terminal of each level of said shift register element other than a last level of the shift register element is connected with the first input terminal of its succeeding level of the shift register element.

15. The display panel according to claim 14, further comprising three clock signal lines; wherein a third input terminal of (3n+1)-th level of the shift register element, a second input terminal of (3n+2)-th level of the shift register element and a fourth input terminal of (3n+3)-th level of the shift register element are connected with the first clock signal line;

wherein a fourth input terminal of the (3n+1)-th level of the shift register element, a third input terminal of the (3n+2)-th level of the shift register element and a second input terminal of the (3n+3)-th level of the shift register element are connected with the second clock signal line; and wherein a second input terminal of the (3n+1)-th level of the shift register element, a fourth input terminal of the (3n+2)-th level of the shift register element, and a third input terminal of the (3n+3)-th level of the shift register element are connected with the third clock signal line;

wherein n represents an integer, and n=0, 1, 2, 3, 4, . . . .

16. The display panel according to claim 14, comprises 4N rows of pixels; wherein the output terminal of each level of shift register element is connected with four rows of pixels.

* * * * *